(12) United States Patent
Ueda

(10) Patent No.: US 7,915,655 B2
(45) Date of Patent: Mar. 29, 2011

(54) SEMICONDUCTOR DEVICE

(75) Inventor: Naohiro Ueda, Kobe (JP)

(73) Assignee: Ricoh Company, Ltd., Tokyo (JP)

( * ) Notice: Subject to any disclaimer, the term of this patent is extended or adjusted under 35 U.S.C. 154(b) by 86 days.

(21) Appl. No.: 12/056,603

(22) Filed: Mar. 27, 2008

(65) Prior Publication Data
US 2008/0237674 A1 Oct. 2, 2008

(30) Foreign Application Priority Data
Mar. 28, 2007 (JP) .................................. 2007-085935

(51) Int. Cl.
*H01L 27/108* (2006.01)
(52) U.S. Cl. ........ 257/296; 257/300; 257/314; 257/315; 257/316; 257/317; 257/318; 257/319; 257/E29.001
(58) Field of Classification Search .................. 257/300, 257/314, 315, 316, 317, 318, E29.001, 296, 257/319
See application file for complete search history.

(56) References Cited

U.S. PATENT DOCUMENTS

| 4,804,637 A | * | 2/1989 | Smayling et al. | ............. 438/264 |
| 5,583,607 A | * | 12/1996 | Fujioka et al. | .................. 355/25 |
| 2003/0034520 A1 | * | 2/2003 | Kusunoki | ...................... 257/344 |

FOREIGN PATENT DOCUMENTS

| JP | 8-107202 | 4/1996 |
| JP | 9-266255 | 10/1997 |
| JP | 11-68070 | 3/1999 |
| JP | 2005-303037 | 10/2005 |

* cited by examiner

*Primary Examiner* — Tan N Tran
(74) *Attorney, Agent, or Firm* — Cooper & Dunham LLP

(57) ABSTRACT

A semiconductor device includes a semiconductor substrate and a metal-oxide semiconductor transistor. A first dielectric layer of the metal oxide semiconductor transistor overlaps source and drain electrodes and a channel region of the transistor. A first drain region is away from the channel region and the first dielectric layer. A second drain region is between the first drain region and the channel region. A gate electrode is on the first dielectric layer and connected to a gate wire, and includes first and second gate layers and a dielectric layer therebetween. The first gate layer has one edge laterally spaced from the first drain region and resting over the second drain region, and is isolated from the gate wire. The second gate layer is over the first gate layer and is connected to the gate wire.

20 Claims, 33 Drawing Sheets

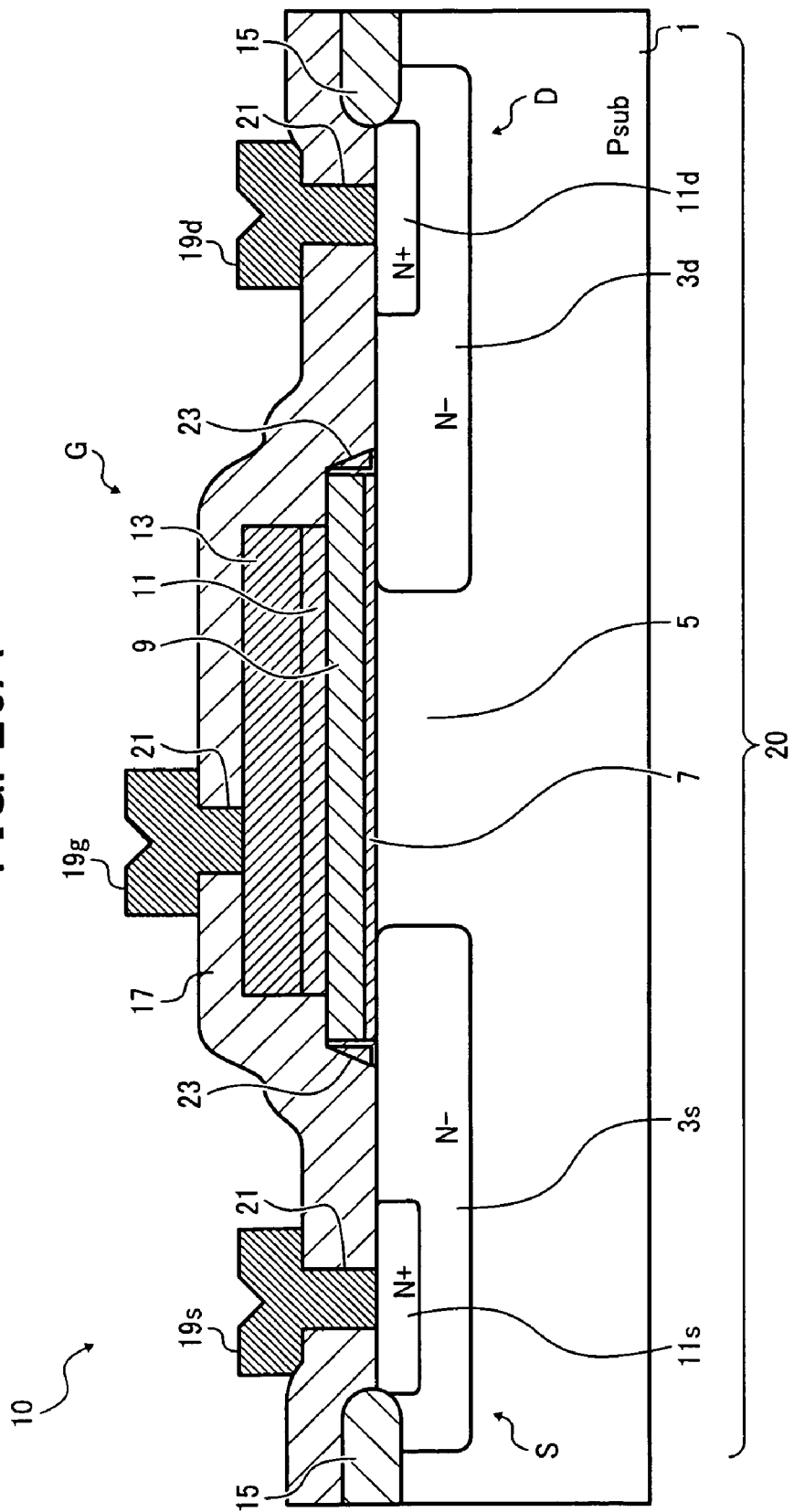

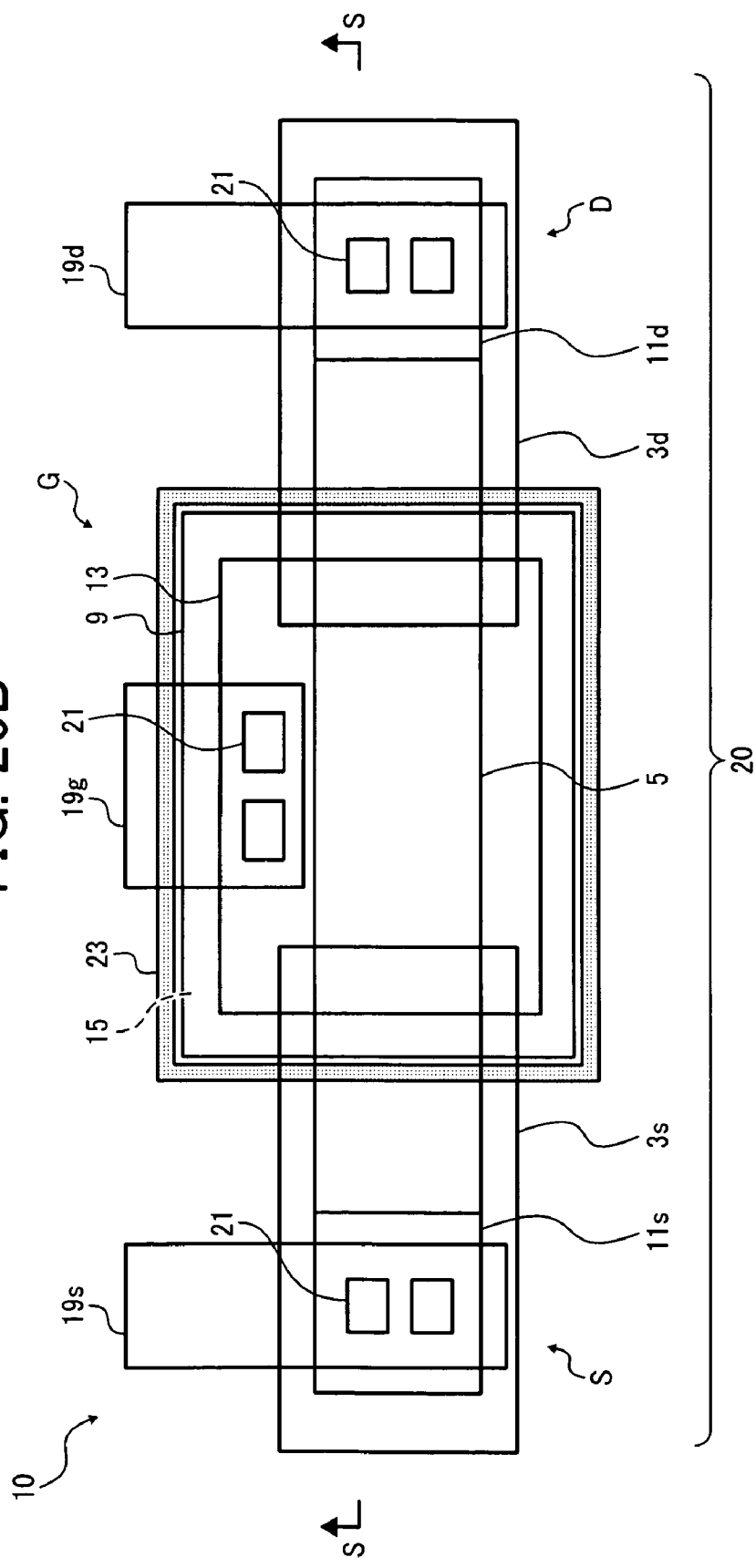

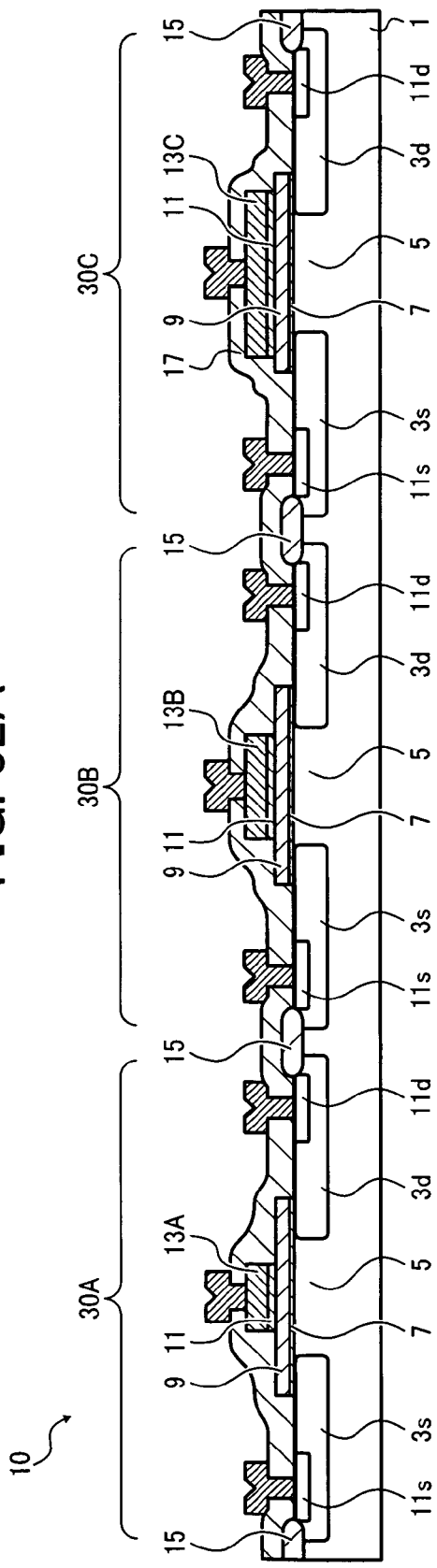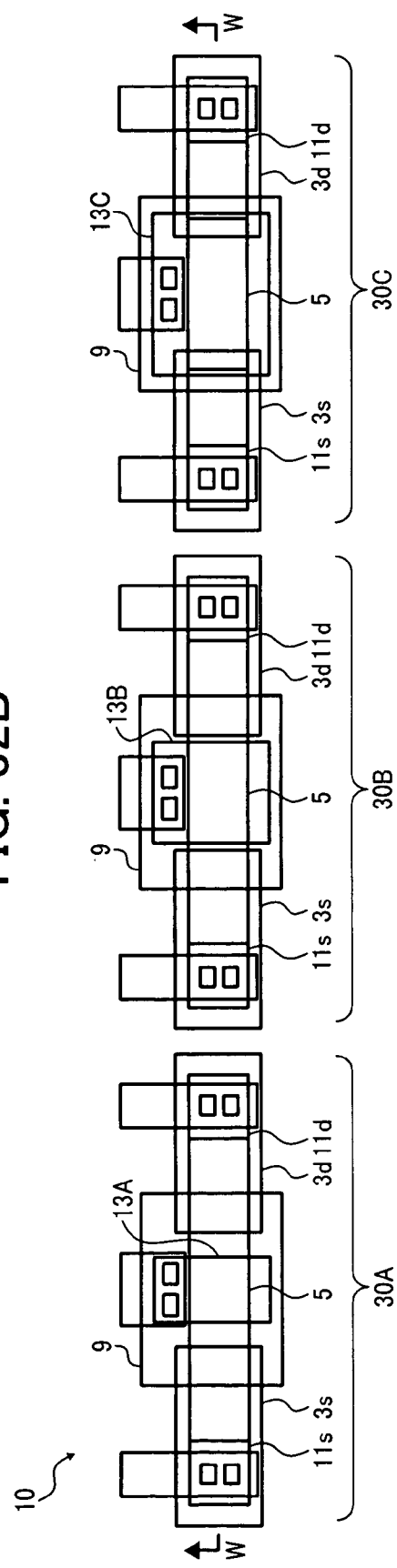
FIG. 32A
FIG. 32B

SEMICONDUCTOR DEVICE

TECHNICAL FIELD

The present disclosure relates to a semiconductor device, and more particularly, to a semiconductor device including a metal-oxide field-effect semiconductor transistor (MOSFET) incorporating a structure, similar to a local oxidation of silicon (LOCOS) offset structure and/or a masked-lightly doped drain (LDD) structure, which can withstand high voltage without requiring a thick gate dielectric layer.

DISCUSSION OF THE BACKGROUND

With recent growth in the market for mobile media devices such as mobile phones and handheld game consoles, development of high performance drive circuitry for liquid crystal display (LCD) is demanded. Constructing an LCD driver using large scale integration (LSI) commonly requires high voltage transistors for handling high voltages supplied to a backlight illuminator or the like. Examples of high voltage transistors with complementary metal-oxide semiconductor (CMOS) architecture include those having a local oxidation of silicon (LOCOS) offset structure, referred to as LOCOS-offset transistors, and those having a masked-lightly doped drain (LDD) structure, referred to as masked-LDD transistors.

One structural feature that is common between the LOCOS-offset transistor and the masked-LDD transistor is an increased thickness of gate dielectric layer, such as 80 nanometers (nm) for an assumed breakdown voltage of 30 volts (V). Since a gate electrode of such a high voltage transistor should support high voltages, it is necessary to increase the gate dielectric thickness, which can be even greater than 80 nm when a higher breakdown voltage is required.

However, forming such thick gate dielectric layers in LOCOS-offset and masked-LDD devices poses various constraints or problems in fabrication of these high voltage transistors.

One problem is that forming a thick dielectric layer requires longer process time for thermally oxidizing a surface of a silicon substrate. This typically induces redistribution of impurities in the substrate, including those present in a well region or channel dopants implanted for adjusting threshold voltage. In particular, a significantly long oxidation time, which is needed to create a gate dielectric layer of a thickness greater than approximately 50 nm, may result in a loss of precision in the performance of fabricated devices. The longer process time problem causes difficulties in the LSI of high voltage transistors since as a result of long oxidation, similar defects may also occur in other devices simultaneously fabricated on a single chip with high voltage transistors, such as capacitors, resistors, and/or non-high voltage transistors, making inoperative the whole circuit.

Another problem encountered in the fabrication of high voltage transistors arises subsequent to the formation of the thick dielectric layer. FIGS. 1 through 3 are schematic diagrams illustrating fabrication of a conventional LOCOS-offset transistor.

Referring to FIG. 1, a p-type semiconductor substrate 101 having already undergone several processing steps to form the LOCOS-offset structure is depicted. After forming a field oxide layer 115 using a LOCOS technique, a thick dielectric layer 151 is formed on the semiconductor substrate 101 which has drain and source regions 103s and 103d with a channel region 105 defined therebetween. Subsequently, a polycrystalline silicon layer is formed on the entire surface of the semiconductor substrate 101.

The polycrystalline silicon layer is then etched using a resist pattern, not shown, so as to form a gate electrode 153 on the dielectric layer 151 as shown in FIG. 2. Portions of the dielectric layer 151 that are not covered by the gate electrode 153 are removed by a subsequent wet etch process as shown in FIG. 3, after which an ion implantation is carried out to form n-type heavily doped (i.e., N+ doped) drain and source regions, not shown.

In the fabrication process described above, the surface of the semiconductor substrate 101 is partially exposed by removing the dielectric layer 151 before forming the N+ regions therein. This dielectric removal is an indispensable step because otherwise, the thick dielectric layer 151 would interfere with proper implantation of dopants in the drain and source regions.

The wet etch process for the dielectric removal may take time when the dielectric layer 151 is relatively thick, e.g., approximately 80 nm. Such problem of longer etch times occurs in fabricating the LOCOS-offset structure illustrated above as well as the masked-LDD structure since both include a thick dielectric layer required to withstand high drive voltages.

Further, the dielectric removal operation may induce an additional problem in the LOCOS-offset structure fabrication. Referring to FIG. 4, an enlarged diagram schematically illustrating edge portions of the field oxide layer 115 (indicated by dotted circles in FIG. 3) is illustrated. As shown in FIG. 4, the field oxide layer 115 is slightly etched off and deformed during the dielectric removal, leaving recesses 155 between the semiconductor surface and the edge portions, which reduces accuracy in transistor layout and may affect electrical performance of the LOCOS-offset transistor. This problem may also occur in the fabrication of the masked-LDD structure that includes a LOCOS layer defining a transistor active region.

Consequently, what is demanded is a semiconductor device incorporating a high voltage MOS transistor that can be fabricated without forming a thick gate dielectric layer to support high drive voltages. Such a semiconductor device Facilitates and simplifies integration of high voltage transistors in large scale circuits.

BRIEF SUMMARY

This disclosure describes a novel semiconductor device including a metal-oxide field-effect semiconductor transistor (MOSFET) incorporating a masked-lightly doped drain (LDD) structure.

In an aspect of the disclosure, a novel semiconductor device includes a semiconductor substrate of a first conductivity type, and a metal-oxide semiconductor transistor constructed on the semiconductor substrate. The metal-oxide semiconductor transistor includes source and drain electrodes, a channel region, a first dielectric layer, and a gate electrode. The source and drain electrodes are of a second conductivity type, disposed beneath a surface of the semiconductor substrate, and spaced apart from each other. The channel region is defined between the source and drain electrodes beneath the surface of the semiconductor substrate. The first dielectric layer is disposed on the semiconductor substrate and overlaps the source and drain electrodes and the channel region therebetween. The gate electrode is disposed on the first dielectric layer and connected to a gate wire to receive a gate voltage. The drain electrode includes a first drain region and a second drain region. The first drain region is located away from the channel region and from the first dielectric layer. The second drain region is located between the first drain region and the channel region, and has a planar surface extending between edges of the first drain region and the first dielectric layer. The gate electrode includes a first gate layer, a second gate layer, and a dielectric layer. The first gate layer is located on the first dielectric layer, has one edge laterally spaced from the first drain region and resting over the second drain region, and is electrically isolated from the gate wire. The second gate layer is located over the first gate layer, and is electrically connected to the gate wire. The dielectric layer is located between and electrically isolates the first gate layer and the second gate layer.

In another aspect of the present disclosure, a novel semiconductor device includes a semiconductor substrate of a first conductivity type, and a plurality of metal-oxide semiconductor transistors, each metal-oxide semiconductor transistor being constructed on the semiconductor substrate. Each of the plurality of metal-oxide semiconductor transistor includes source and drain electrodes, a channel region, a first dielectric layer, and a gate electrode. The source and drain electrodes are of a second conductivity type, disposed beneath a surface of the semiconductor substrate, and spaced apart from each other. The channel region is defined between the source and drain electrodes beneath the surface of the semiconductor substrate. The first dielectric layer is disposed on the semiconductor substrate and overlaps the source and drain electrodes and the channel region therebetween. The gate electrode is disposed on the first dielectric layer and connected to a gate wire to receive a gate voltage. The drain electrode includes a first drain region and a second drain region. The first drain region is located away from the channel region and from the first dielectric layer. The second drain region is located between the first drain region and the channel region, and has a planar surface extending between edges of the first drain region and the first dielectric layer. The gate electrode includes a first gate layer, a second gate layer, and a dielectric layer. The first gate layer is located on the first dielectric layer, has one edge laterally spaced from the first drain region and resting over the second drain region, and is electrically isolated from the gate wire. The second gate layer is located over the first gate layer, and is electrically connected to the gate wire. The dielectric layer is located between and electrically isolates the first gate layer and the second gate layer to provide a capacitance therebetween, with such capacitance varying among the plurality of metal-oxide semiconductor transistors.

Methods for fabricating the above-mentioned semiconductor devices are also provided herein.

BRIEF DESCRIPTION OF THE DRAWINGS

A more complete appreciation of the aforementioned and other aspects, features and advantages will be readily obtained as the same becomes better understood by reference to the following detailed description when considered in connection with the accompanying drawings, wherein:

FIGS. 26A and 26B are cross-sectional and plan diagrams, respectively, schematically illustrating an example of the semiconductor device produced through the fabrication process of FIGS. 18A through 23B;

FIGS. 32A and 32B are cross-sectional and plan diagrams, respectively, schematically illustrating the semiconductor device according to still another exemplary embodiment of this disclosure;

DETAILED DESCRIPTION OF PREFERRED EMBODIMENTS

Figure 1:
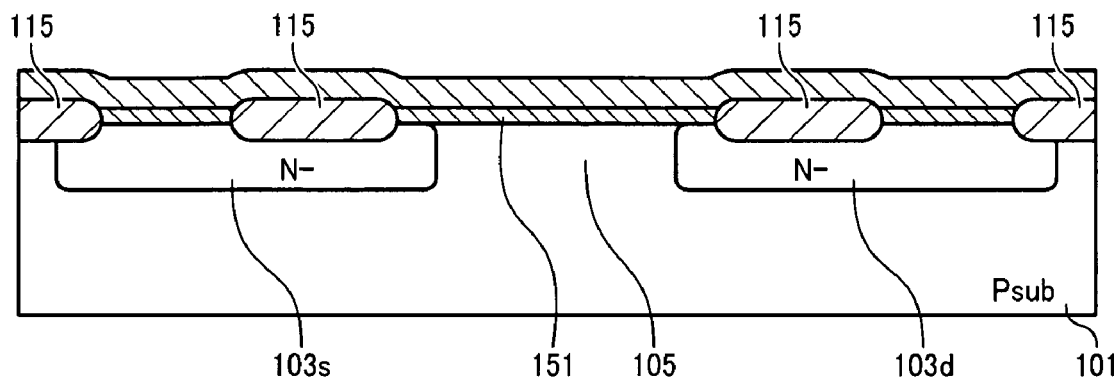
FIGS. 1 through 3 are schematic diagrams illustrating fabrication of a conventional transistor having a local oxidation of silicon (LOCOS) offset structure.
Figure 2:
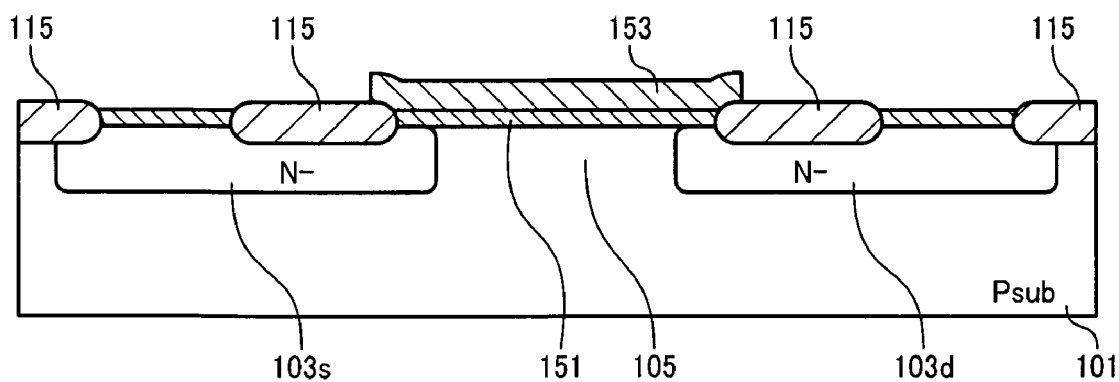
Figure 3:
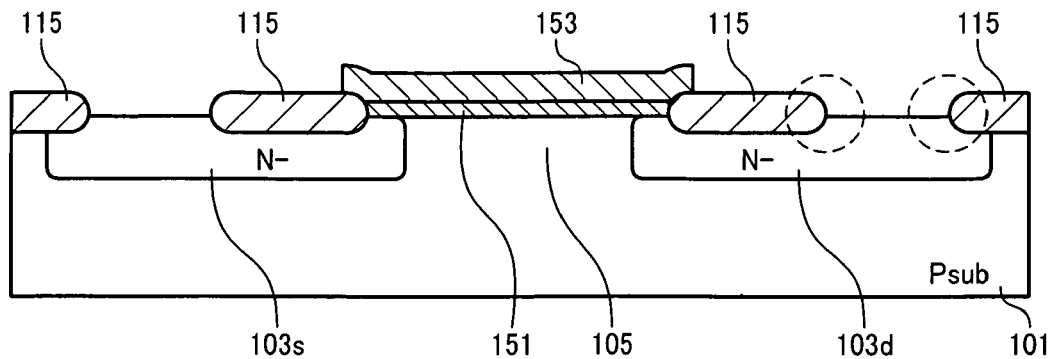
Figure 4:
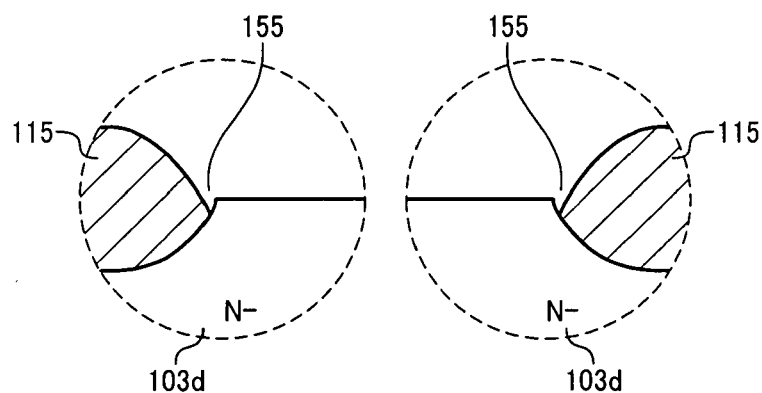
FIG. 4 is an enlarged diagram schematically illustrating portions of the conventional transistor indicated by dotted circles in FIG. 3.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner.

Referring now to the drawings, wherein like reference numerals designate identical or corresponding parts throughout the several views, examples and exemplary embodiments of this disclosure are described.

Figure 5:
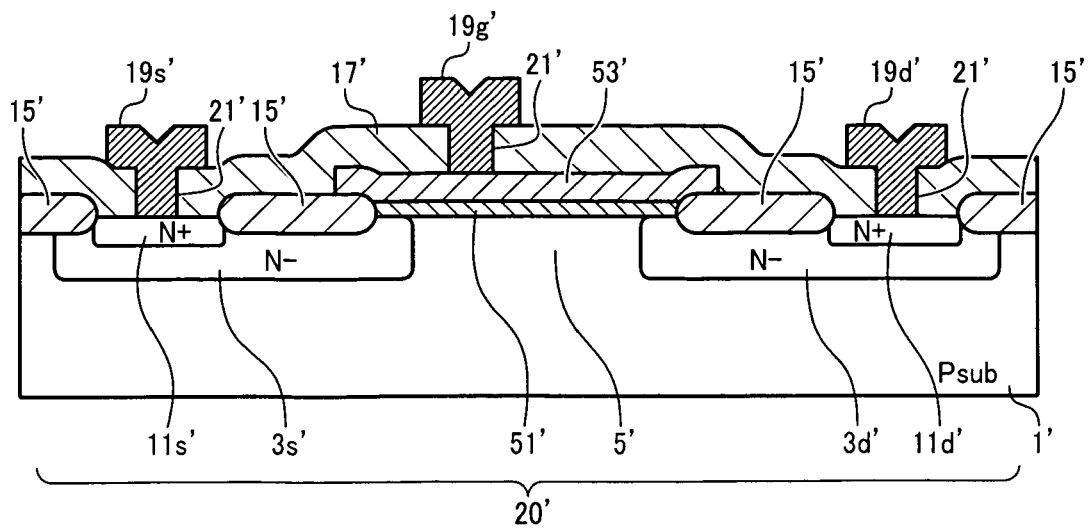
FIG. 5 is a cross-sectional diagram schematically illustrating an example of an n-channel metal-oxide semiconductor (NMOS) transistor having a LOCOS-offset structure.

Referring to FIG. 5, a cross-sectional diagram schematically illustrating an example of an n-channel metal-oxide semiconductor (NMOS) transistor 20' having a local oxidation of silicon (LOCOS) offset structure is shown.

As shown in FIG. 5, the MOS transistor 20' is constructed on a p-type semiconductor substrate 1', and includes an n-type lightly doped drain and source regions 3d' and 3s', located apart from each other in a p-type well, not shown, and defining a channel region 5' therebetween, as well as a gate dielectric layer 51' and a gate electrode 53' stacked on the semiconductor substrate 1'. The MOS transistor 20' further includes an n-type heavily doped (i.e., N+) drain and source regions 11d' and 11s', each surrounded by the drain and source regions 3d' and 3s' below a surface of the semiconductor substrate 1'.

On the surface of the semiconductor substrate 1', a field oxide layer 15' grown by a LOCOS technique and defining an active region of the MOS transistor 20' is formed with a thickness greater than that of the gate dielectric layer 51'. The field oxide layer 15' overlies a portion of the drain region 3d' between the gate dielectric layer 51' and the N+ drain region 11d' as well as a portion of the source region 3s' between the gate dielectric layer 51' and the N+ source region 11s'. The gate electrode 53' has outer edges lying on the field oxide layer 15'.

Further, a silicon oxide insulating layer 17' is disposed over the gate electrode 53', the N+ drain and source regions 11d' and 11s', and the field oxide layer 15'. The insulating layer 17' has via holes 21' penetrating therethrough to connect the gate electrode 53' to a gate wire 19g', the drain region 11d' to a drain wire 19d', and the source region 11s' to a source wire 19s', respectively. The wires 19g', 19d', and 19s' are formed of metal and extend across the insulating layer 17'.

Referring now to FIGS. 6 through 10, cross-sectional diagrams schematically illustrating fabrication of the MOS transistor 20' are shown.

Figure 6:
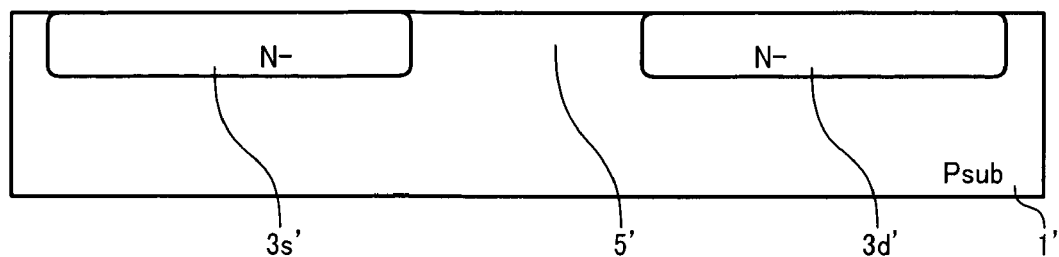
FIGS. 6 through 10 are cross-sectional diagrams schematically illustrating fabrication of the MOS transistor of FIG. 5.

Referring to FIG. 6, after the p-well, not shown, is formed in the p-type substrate 1', a photolithographic process is performed to develop a photoresist pattern over the semiconductor substrate 1'. The semiconductor substrate 1' thus masked is subjected to phosphorous ion implantation with a dose of approximately $2.0*10^{13}$ ions/cm$^2$ at an energy of approximately 100 kiloelectron volts (KeV) The implanted ions are diffused and activated under nitrogen atmosphere at approximately 1000° C. for approximately 30 minutes to obtain the N-doped drain and source regions 3d' and 3s'.

Figure 7:
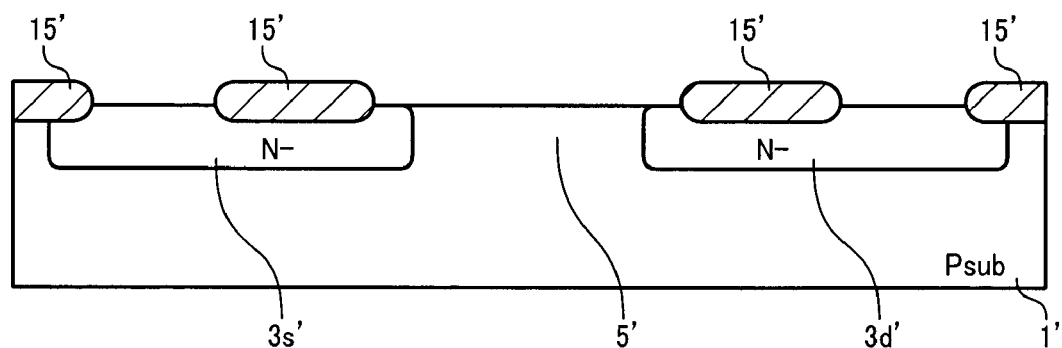

Then, the field oxide layer 15' is grown to a thickness of approximately 500 nanometers (nm) using a suitable LOCOS insulation technique as shown in FIG. 7.

Figure 8:
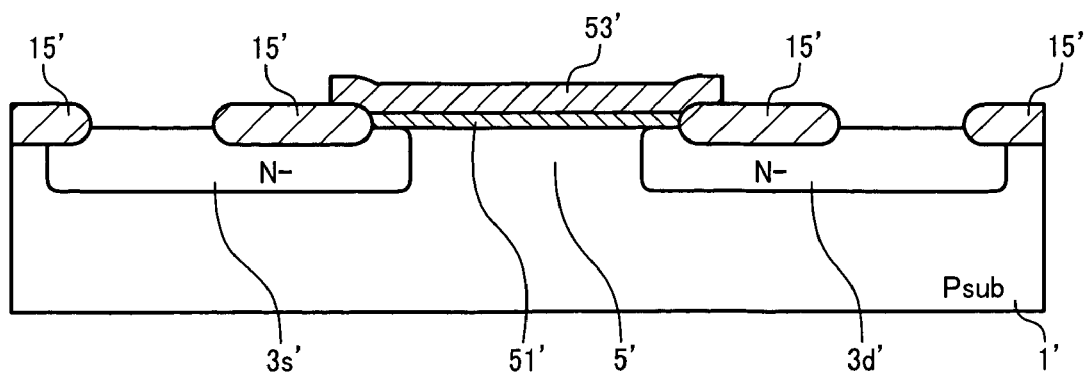

After forming the field oxide layer 15', a dielectric layer of a thickness of approximately 80 nm is formed on a surface of the semiconductor substrate 1', and subsequently a polycrystalline silicon layer is formed thereon to a thickness of approximately 300 nm. A photoresist mask is formed through photolithographic process to etch the polycrystalline silicon layer and the dielectric film. With reference to FIG. 8, this etching is sequentially performed to obtain the gate electrode 53' and the underlying gate dielectric layer 51', after which the masking photoresist is removed. As shown in the drawing, the gate electrode 53' has outer edges lying on the field oxide layer 15'.

Figure 9:
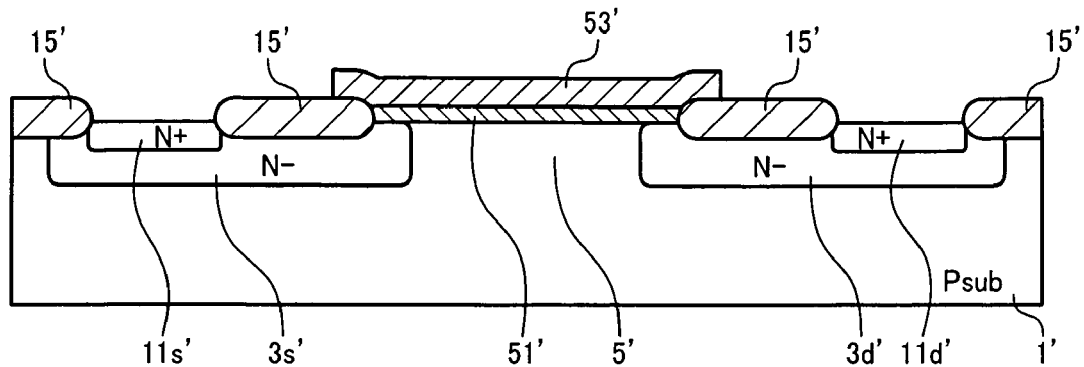

Thereafter, a photoresist pattern is formed to cover the semiconductor substrate 1' exposing the active region of the MOS transistor 20'. The semiconductor substrate 1' thus masked is subjected to arsenic ion implantation with a dose of approximately $5.0*10^{15}$ ions/cm$^2$ at an energy of approximately 30 KeV. The implanted ions are diffused and activated under nitrogen atmosphere at approximately 900° C. for approximately 30 minutes to form the N+ drain and source regions 11d' and 11s'. As shown in FIG. 9, the MOS transistor 20' has a double diffused drain/source structure, in which the drain regions 3d' and 11d' of different doping concentrations together form a drain electrode, and the source regions 3s' and 11s' of different doping concentrations together form a source electrode.

Figure 10:
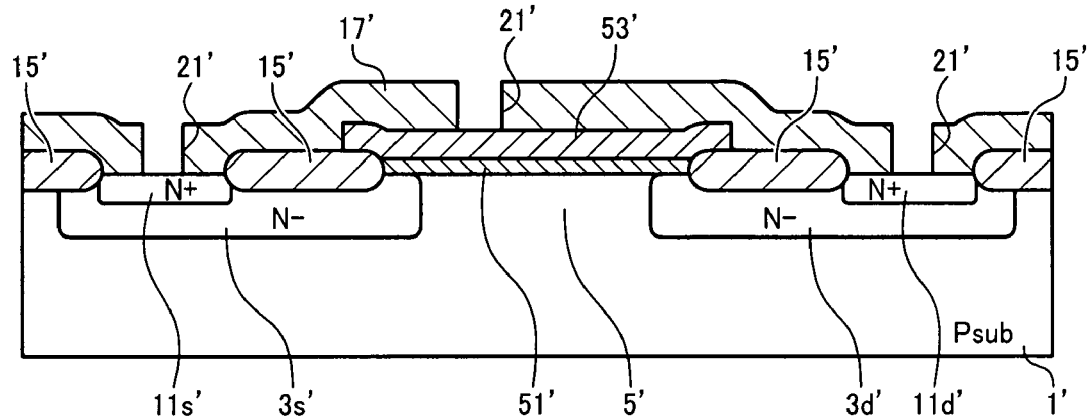

Subsequent to the formation of the MOS structure, a layer of silicon oxide material is formed over the entire surface of the semiconductor structure to a thickness of approximately 1000 nm. A masking resist pattern is formed to selectively etch the silicon oxide layer to obtain the insulating layer 17' with the via holes 21' exposing the surfaces of the gate electrode 53' and the N+ drain and source regions 11d' and 11s' as shown in FIG. 10.

Thereafter, a layer of metal such as aluminum is applied over the insulating layer 17' and patterned to form the wires 19g', 19d', and 19s', respectively, so as to obtain the MOS transistor 20' as shown in FIG. 5.

The MOS transistor 20' fabricated through such procedure is commonly referred to as a LOCOS-offset transistor, which exhibits a high breakdown voltage owing to the following geometric characteristics:

(1) Double diffused structure wherein the drain and source electrodes have graded doping concentrations; and (2) The gate electrode has outer edges lying on the field oxide layer that is thicker than the gate dielectric layer.

Voltage withstanding capability of drain/source regions of a transistor is determined by avalanche breakdown voltage. As shown in FIG. 5, the double diffused structure of the LOCOS-offset transistor, in which the heavily doped N+ drain /source region is separated from the p-type well region by the lightly doped drain/source region, offers an increased avalanche breakdown voltage such as approximately 30 V for the drain and source regions. The LOCOS-offset transistor can withstand higher voltages than a MOS transistor with non LOCOS-offset structure that generally exhibits an avalanche breakdown voltage of approximately 10 V.

Further, it is known that connecting a gate electrode of a MOS transistor to ground reduces the breakdown voltage of a pn junction underneath the gate electrode. This is commonly referred to as gate-aided breakdown, and occurs in a general MOS device at a relatively low voltage such as 10 V. The LOCOS-offset structure, wherein the outer edges of the gate electrode is supported by the field oxide layer which is thicker than the gate dielectric layer, increases the vertical distance between the gate electrode and the N+ drain/source region, thus achieving a high gate-aided breakdown voltage such as approximately 30 V.

Figure 11:
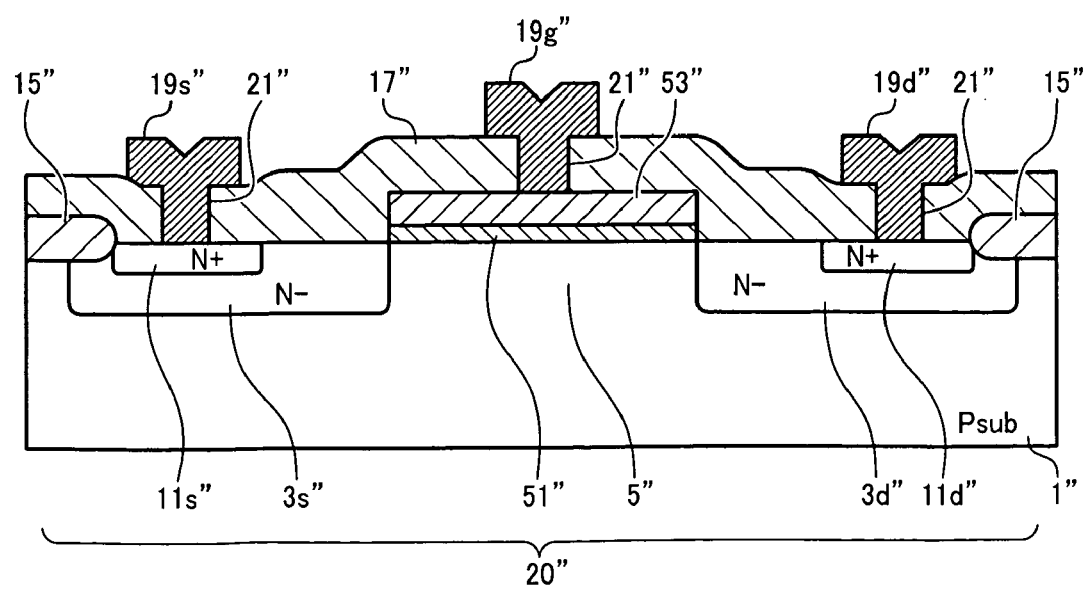
FIG. 11 is a cross-sectional diagram schematically illustrating an example of an NMOS transistor having a masked-lightly doped drain (LDD) structure.

Referring now to FIG. 11, a cross-sectional diagram schematically illustrating an example of an NMOS transistor 20" having a masked-lightly doped drain (LDD) structure is shown.

As shown in FIG. 11, the MOS transistor 20" is constructed on a p-type semiconductor substrate 1", and includes an n-type lightly doped drain and source regions 3d" and 3s", located apart from each other in a p-type well, not shown, and defining a channel region 5" therebetween, as well as a gate dielectric layer 51" and a gate electrode 53" stacked on the semiconductor substrate 1". The MOS transistor 20" further includes an N+ drain and source regions 11d" and 11s", each surrounded by the drain and source regions 3d" and 3s" below a surface of the semiconductor substrate 1". Both the N+ drain and source regions 11d" and 11s" are laterally spaced from the gate electrode 53".

On the surface of the semiconductor substrate 1", a field oxide layer 15" grown by LOCOS technique and defining an active region of the MOS transistor 20" is formed with a thickness greater than that of the gate dielectric layer 51". The field oxide layer 15" does not extend over the active region of the MOS transistor 20".

Further, a silicon oxide insulating layer 17" is disposed over the gate electrode 53", the N+ drain and source regions 11d" and 11s", and the field oxide layer 15". The insulating layer 17" has via holes 21" penetrating therethrough to connect the gate electrode 53" to a gate wire 19g", the drain region 11d" to a drain wire 19d", and the source region 11s" to a source wire 19s", respectively. The wires 19g", 19d", and 19s" are formed of metal and extend across the insulating layer 17".

Referring now to FIGS. 12 through 16, cross-sectional diagrams schematically illustrating fabrication of the MOS transistor 20" are shown.

Figure 12:
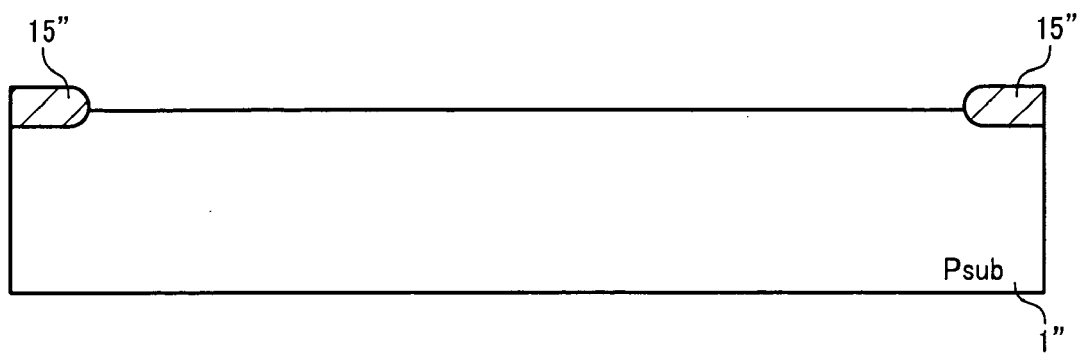
FIGS. 12 through 16 are cross-sectional diagrams schematically illustrating fabrication of the MOS transistor of FIG. 11.

Referring to FIG. 12, after the p-well, not shown, is formed in the p-type substrate 1", the field oxide layer 15" is grown to a thickness of approximately 500 nm using a suitable LOCOS insulation technique.

Figure 13:
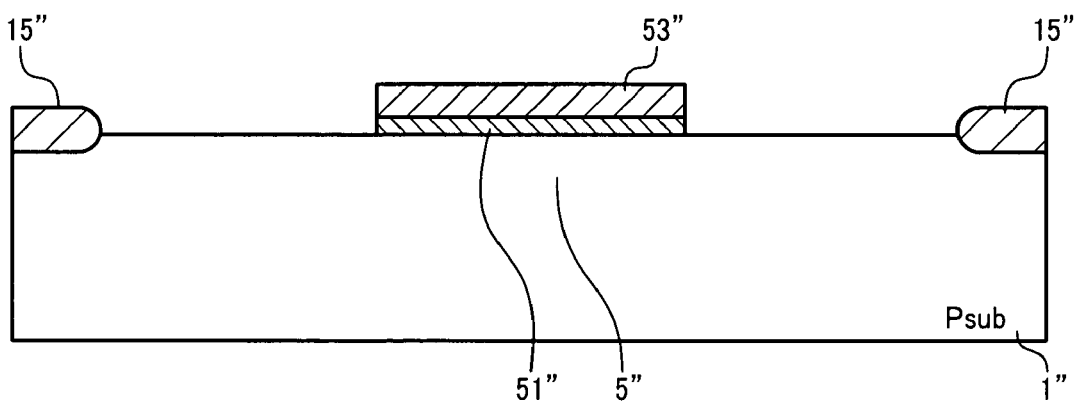

Then, a dielectric layer of a thickness of approximately 80 nm is formed on a surface of the semiconductor substrate 1", and subsequently a polycrystalline silicon layer is formed thereon to a thickness of approximately 300 nm. A photoresist mask is formed through photolithographic process to etch the polycrystalline silicon layer and the dielectric film. With reference to FIG. 13, this etching is sequentially performed to obtain the gate electrode 53" and the underlying gate dielectric layer 51", after which the masking photoresist is removed.

Figure 14:
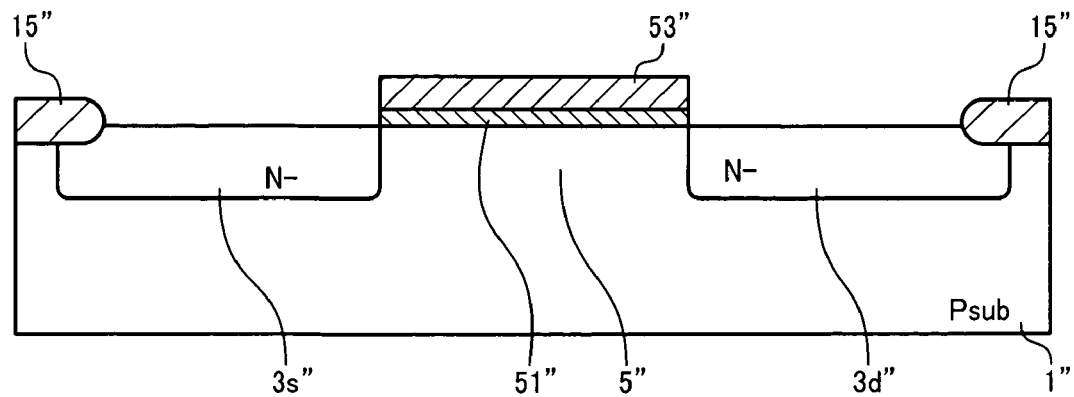

Thereafter, a photoresist pattern is formed to cover the semiconductor substrate 1" exposing the active region of the MOS transistor 20". The semiconductor substrate 1' thus masked is subjected to phosphorous ion implantation with a dose of approximately $2.0*10^{13}$ ions/cm$^2$ at an energy of approximately 30 KeV. The implanted ions are diffused and activated under nitrogen atmosphere at approximately 900° C. for approximately 30 minutes to form the N-doped drain and source regions 3d" and 3s" as shown in FIG. 14.

Figure 15:
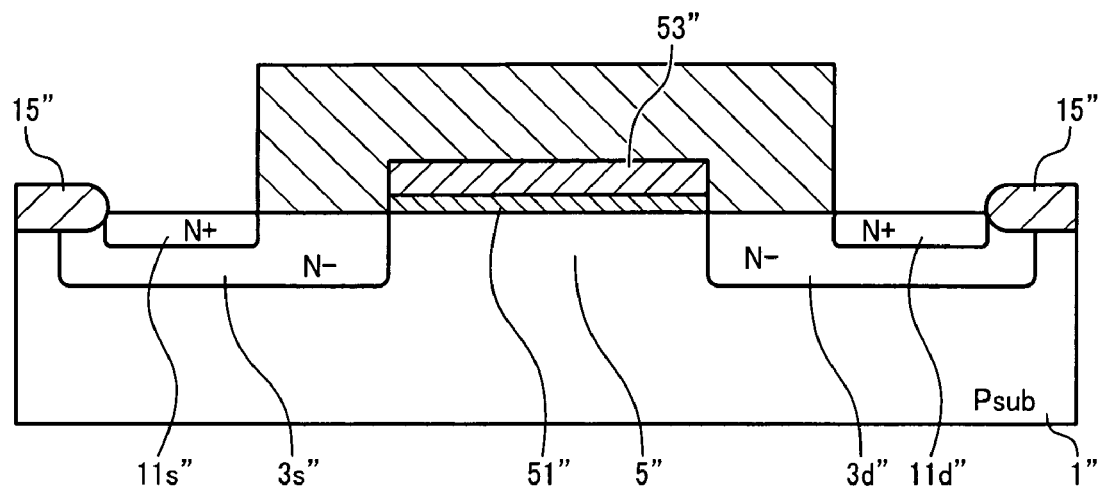

Subsequently, another photoresist pattern is formed over the gate electrode 53 and portions of the drain and source regions 3d" and 3s" adjoining thereto. The semiconductor substrate 1" thus masked is subjected to arsenic ion implantation with a dose of approximately $5.0*10^{15}$ ions/cm$^2$ at an energy of approximately 30 KeV. The implanted ions are diffused and activated under nitrogen atmosphere at approximately 900° C. for approximately 30 minutes to obtain the N+ drain and source regions 11d" and 11s". As shown in FIG. 15, the MOS transistor 20" has a double diffused drain/source structure, in which the drain regions 3d" and 11d" of different doping concentrations together form a drain electrode, and the source regions 3s" and 11s" of different doping concentrations together form a source electrode.

Figure 16:
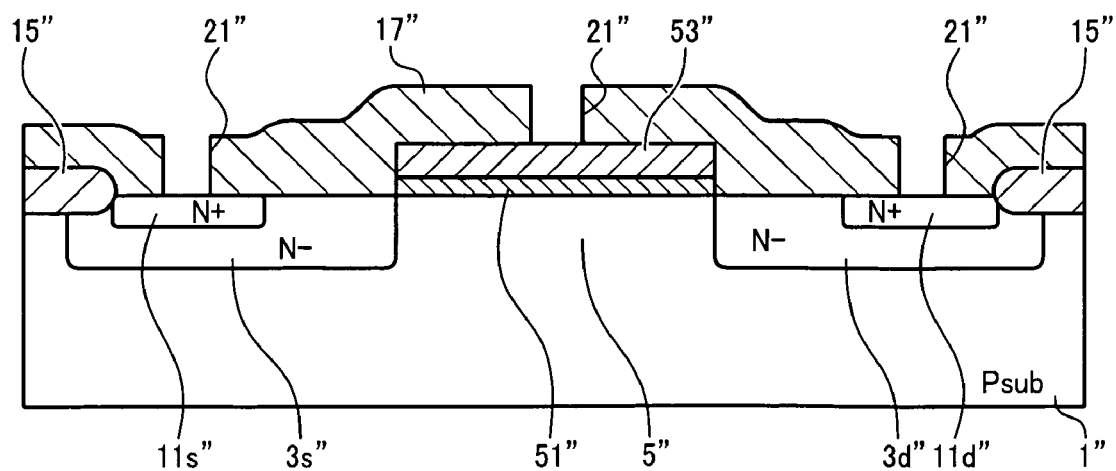

Subsequent to the formation of the MOS structure, a layer of silicon oxide material is formed over the entire surface of the semiconductor structure to a thickness of approximately 1000 nm. A masking resist pattern is formed to selectively etch the silicon oxide layer to obtain the insulating layer 17" with the via holes 21" exposing the surfaces of the gate electrode 53" and the N+ drain and source regions 11d" and 11s" as shown in FIG. 16.

Thereafter, a layer of metal such as aluminum is applied over the insulating layer 17" and patterned to form the wires 19g", 19d", and 19s", respectively, so as to obtain the MOS transistor 20" as shown in FIG. 11.

The MOS transistor 20" fabricated through such procedure is commonly referred to as a masked-LDD transistor. A masked-LDD transistor differs from a LOCOS-offset transistor in that the field oxide layer is not formed between the gate electrode and the drain/source electrodes, and the area of the drain/source electrode is defined by using a resist pattern that partly masks the lightly doped drain/source region in the heavy dopant implantation.

The gate-drain or gate-source structure determines electrical properties of the two types of high voltage transistors. Compared to the LOCOS-offset transistor, the masked-LDD transistor with the gate and the drain/source not separated by a thick field oxide layer has a relatively low breakdown voltage although able to drive larger current. Accordingly, the masked-LDD structure is suitable for applications where high current drive capability and moderate breakdown voltage are both required, while the LOCOS-offset structure is commensurable with high voltage applications which do not require large drive currents. The masked-LDD and LOCOS-offset structures described above may be applied to only a drain electrode or to both drain and source electrodes of a MOS transistor according to the intended use.

Figure 17A:
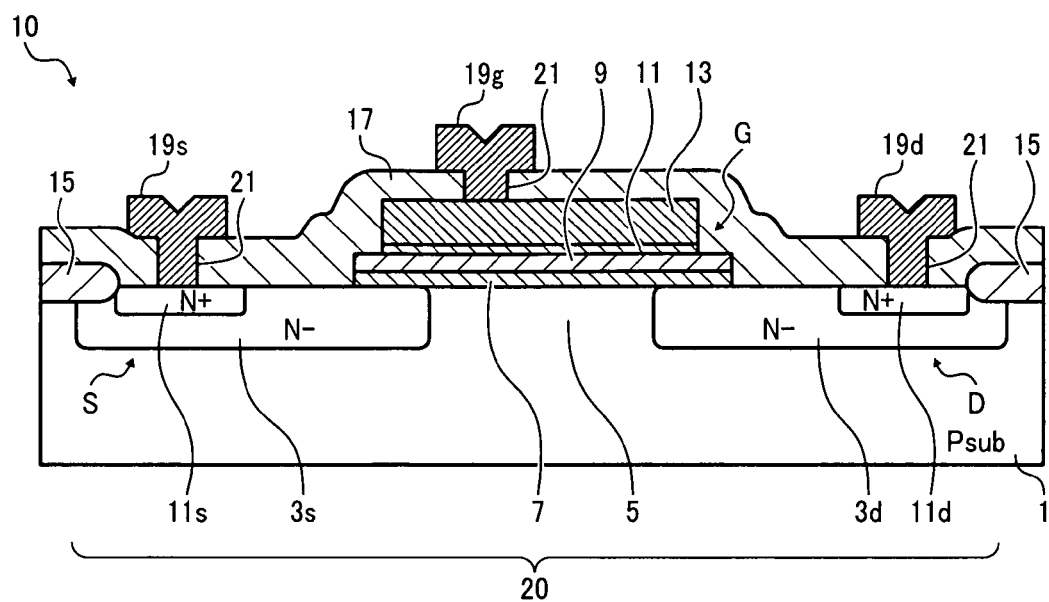
FIGS. 17A and 17B are cross-sectional and plan diagrams, respectively, schematically illustrating a semiconductor device according to an exemplary embodiment of this disclosure.
Figure 17B:
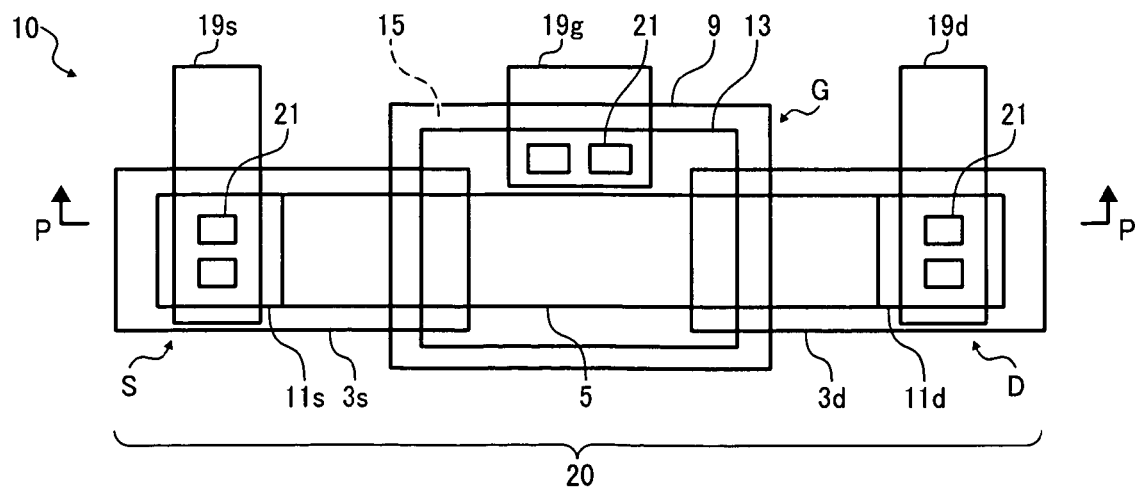

FIGS. 17A and 17B are schematic diagrams illustrating a semiconductor device 10 according to an exemplary embodiment of this disclosure. FIG. 17B provides a plan view, and FIG. 17A provides a cross-sectional view taken along line P-P of FIG. 17B.

As shown in FIGS. 17A and 17B, the semiconductor device 10 includes a p-type semiconductor substrate 1 having a p-type well, not shown, in which an N-channel MOS transistor 20 is formed. The MOS transistor 20 includes drain and source electrodes D and S below a surface of the semiconductor substrate 1 and a gate electrode G on the surface of the semiconductor substrate 1.

The drain and source electrodes D and S are located apart from each other and define a channel region 5 therebetween. The drain electrode D includes an n-type lightly diffused first drain region 3d and an N+ second drain region 11d surrounded by the first drain region 3d beneath the surface of the semiconductor substrate 1. Similarly, the source electrode S includes an n-type lightly diffused first source region 3s and an N+ second source region 11s surrounded by the first source region 3s beneath the surface of the semiconductor substrate 1. Thus, the MOS transistor 20 has a double-diffused drain/source structure, in which the drain and source terminals D and S have graded concentrations of n-type dopants.

The gate electrode G overlies the channel region 5 and adjacent portions of the first drain region 3d and the first source region 3s. The gate electrode G includes a first gate layer 9 disposed above and insulated from the semiconductor substrate 1 by a first dielectric layer 7, and an second gate layer 13 stacked above and insulated from the first gate layer 9 by an second dielectric layer 11. The first gate layer 9 has outer edges laterally spaced from each of the N+ drain and source regions 11d and 11s. The first dielectric layer 7 is formed of silicon oxide and has a thickness of approximately 20 nm, for example. The second dielectric layer 11 is formed of silicon oxide and has a thickness of approximately 20 nm, for example. The first gate layer 9 is formed of polycrystalline silicon and has a thickness of approximately 300 nm, for example. The second gate layer 13 is formed of polycrystalline silicon and has a thickness of approximately 300 nm, for example.

Further, on the surface of the semiconductor substrate 1, a layer of field oxide 15, having a thickness greater than the first dielectric layer 7 (e.g., approximately 500 nm) defines the active areas of the MOS transistor 20. Although not shown in the drawings, edge portions of the first gate layer 9 which do not overlie the first dielectric layer 7 rest on the field oxide layer 15.

Further, components of the semiconductor device 10, including the field oxide layer 15 and the electrodes of the MOS transistor 20, are covered with an insulating layer 17 formed of a suitable dielectric such as silicon oxide. The insulating layer 17 has via holes 21 to receive wires 19g, 19d, and 19s formed of suitable metal such as aluminum and extending across the insulating layer 17. The metal wires 19d and 19s are connected to the N+ drain and source regions 11d and 11s, respectively, and the metal wire 19g is connected to the second gate layer 13 and not to the first gate layer 9.

FIGS. 18A through 23B are, schematic diagrams illustrating an example of a fabrication process for the semiconductor device 10. FIGS. 18B through 23B each provides a plan view, and FIGS. 18A through 23A each provides a cross-sectional view taken along line Q-Q of FIGS. 18B through 23B.

Figure 18A:
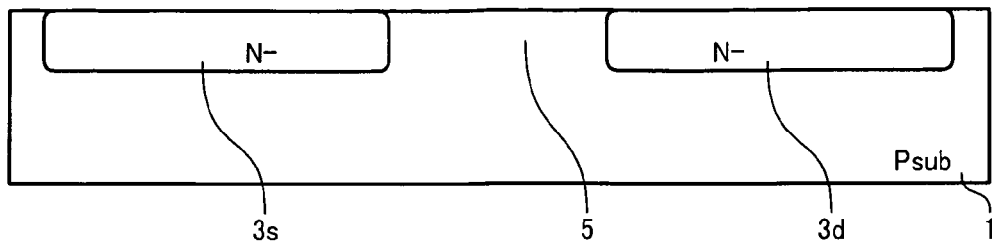
FIGS. 18A through 23B are cross-sectional and plan diagrams schematically illustrating an example of a fabrication process for the semiconductor device of FIG. 17.
Figure 18B:
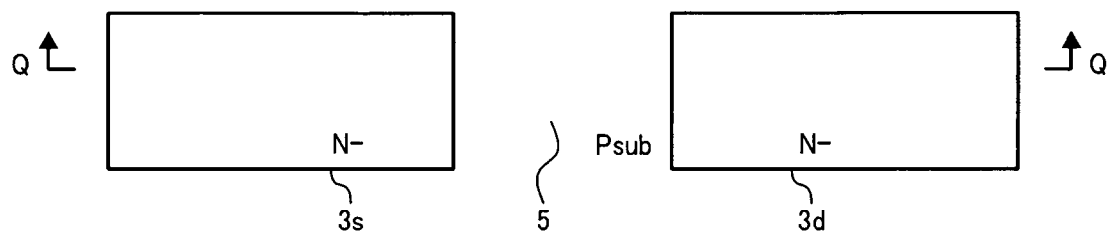

Referring to FIGS. 18A and 18B, after the p-well, not shown, is formed in the semiconductor substrate 1, a photolithographic process is performed to develop a photoresist pattern masking the surface of the semiconductor substrate 1. The semiconductor substrate 1 is then subjected to phosphorous ion implantation with a dose of approximately $2.0*10^{13}$ ions/cm$^2$ at an energy of approximately 100 KeV. The resist pattern is removed, and the implanted ions are diffused and activated under nitrogen atmosphere at approximately 1000° C. for approximately 30 minutes to form the lightly doped first drain and source regions 3d and 3s defining the channel region 5 therebetween.

Figure 19A:
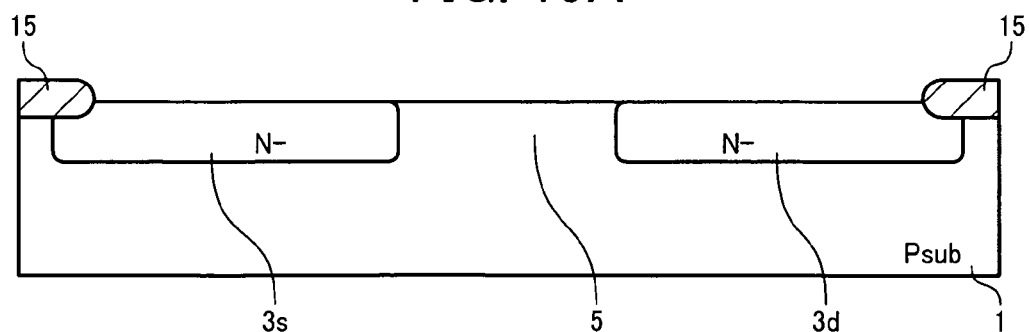
Figure 19B:
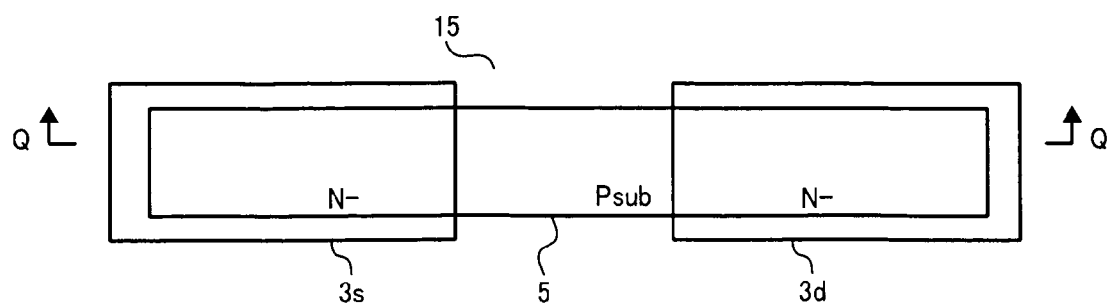

Then, the field oxide layer 15 is grown to a thickness of approximately 500 nm using a suitable LOCOS insulation technique as shown in FIGS. 19A and 19B.

Figure 20A:
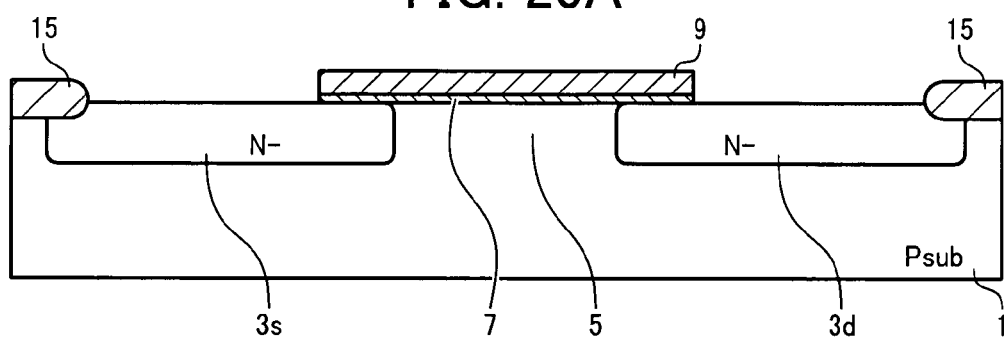
Figure 20B:
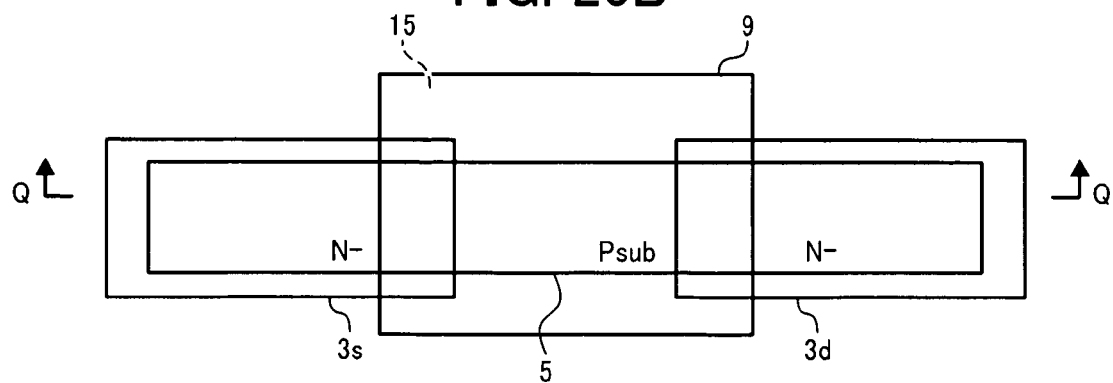

After the LOCOS process, a dielectric layer of a thickness approximately 20 nm is formed on the semiconductor substrate 1, and subsequently a polycrystalline silicon layer is formed thereon to a thickness of approximately 300 nm. Then, a photoresist mask is formed through photolithographic process to anisotropically dry etch the polycrystalline silicon layer and to anisotropically dry or wet etch the dielectric film. With reference to FIGS. 20A and 20B, this etching is sequentially performed to obtain the first gate layer 9 and the first dielectric layer 7 stacked together, after which the masking photoresist is removed. The first gate layer 9 has edge portions overlying the field oxide layer 15.

Figure 21A:
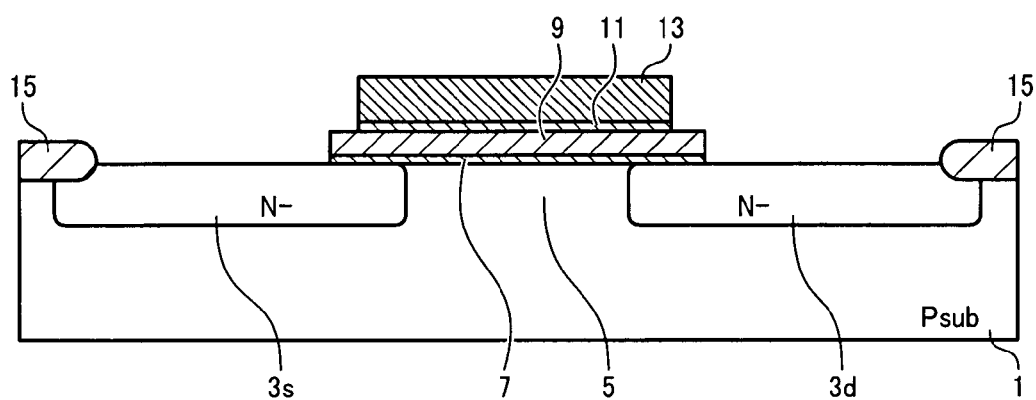
Figure 21B:
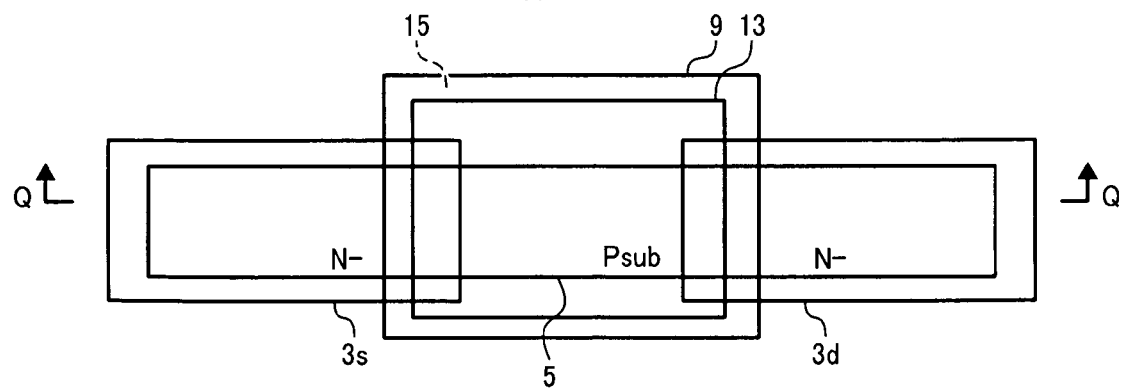

Thereafter, a dielectric layer of a thickness approximately 20 nm is formed on the first gate layer 9, and subsequently a polycrystalline silicon layer is formed thereon to a thickness of approximately 300 nm. Then, a photoresist mask is formed through photolithographic process to anisotropically dry etch the polycrystalline silicon layer and to anisotropically dry or wet etch the dielectric film. With reference to FIGS. 21A and 21B, this etching is sequentially performed to obtain the second gate layer 13 and the second dielectric 11 stacked together, after which the masking photoresist is removed.

Figure 22A:
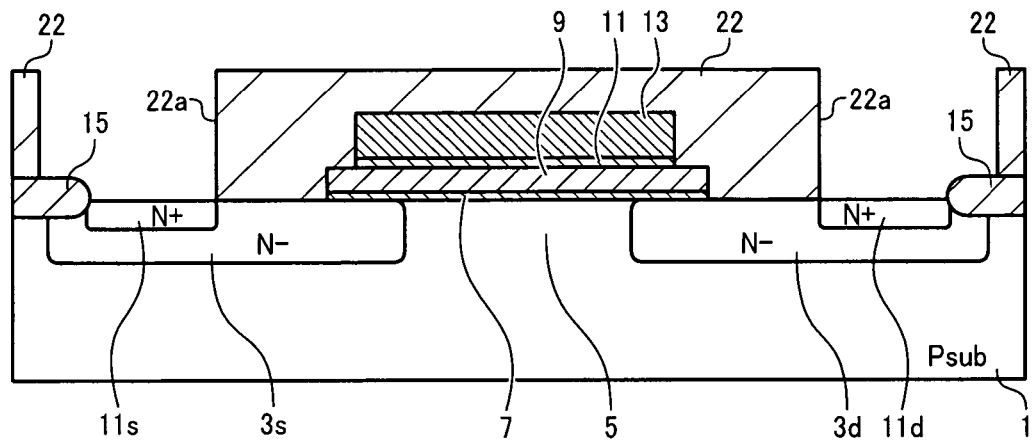
Figure 22B:
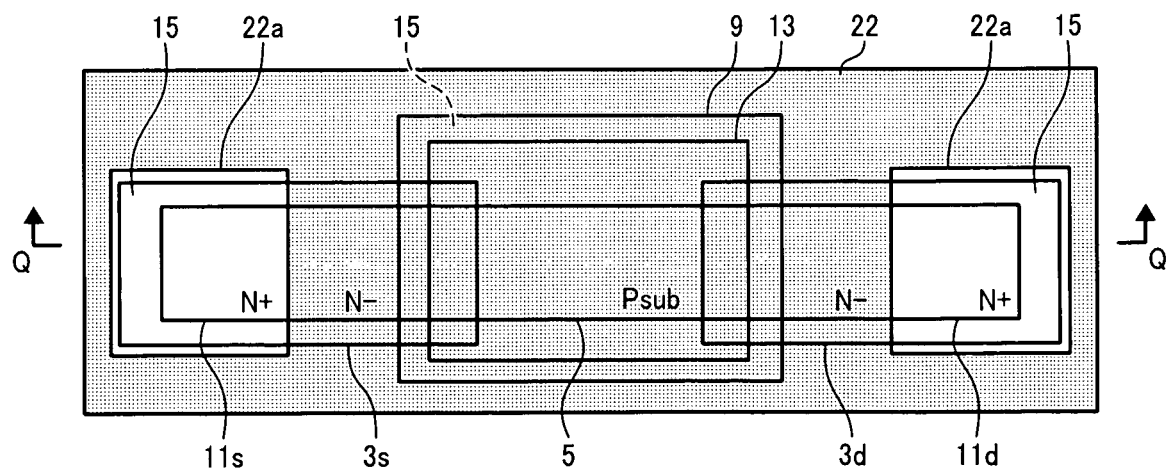

After forming the gate electrode G, a resist pattern 22 is formed to cover the semiconductor substrate 1 with openings 22a exposing portions of the doped regions 3d and 3s, which are aligned parallel to the length of the channel region 5 and spaced away from the adjacent edge of the first gate layer 9 (shown as dotted in FIG. 22B). The semiconductor substrate 1 thus masked is subjected to arsenic ion implantation at an energy of approximately 30 KeV with a dose of approximately $5.0*10^{15}$ ions/cm$^2$. After removing the masking resist, the implanted ions are diffused and activated under nitrogen atmosphere at approximately 900° C. for approximately 30 minutes to form the heavily doped N+ drain and source regions 11d and 11s, surrounded by the lightly doped drain and source regions 3d and 3s as shown in FIGS. 22A and 22B, where the resist pattern 22 removed after ion implantation is shown for the purpose of illustration.

Figure 23A:
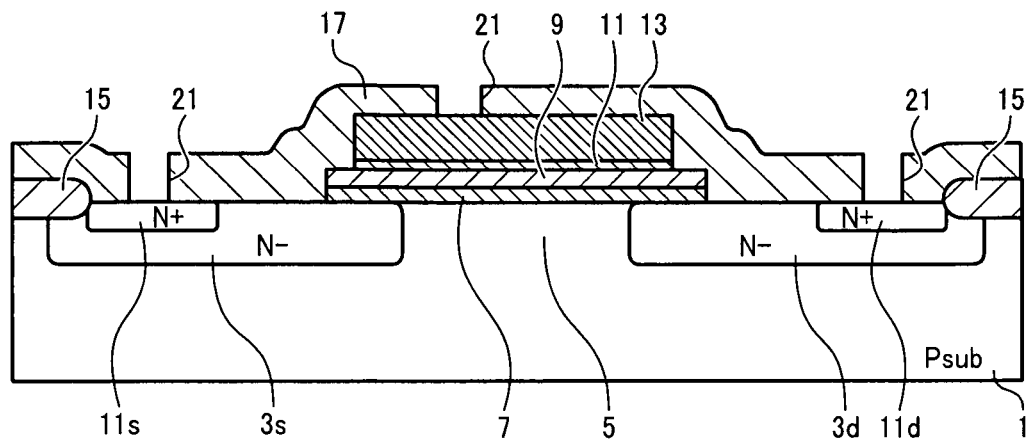
Figure 23B:
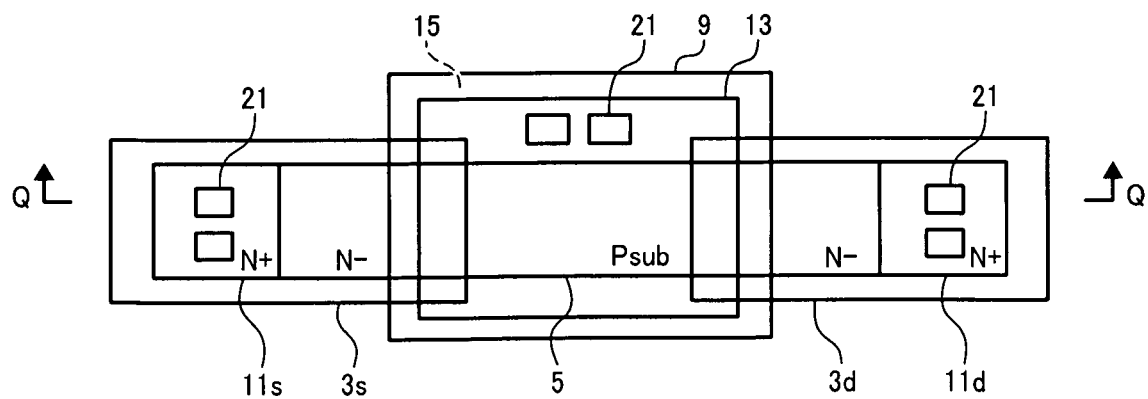

After the double-diffused drain and source electrodes D and S are thus formed, a dielectric film of silicon oxide material, such as a stacked layer of non-doped silicate glass (NSG) and boro-phosphosilicate glass (BPSG), is formed to a thickness of approximately 1000 nm over an entire area of the semiconductor substrate 1. The dielectric film is etched using a patterned resist mask to obtain the insulating layer 17 with the via holes 21 at portions corresponding to the N+ drain and source regions 11d and 11s and the second gate layer 13 as shown in FIGS. 23A and 23B.

Thereafter, a layer of suitable metal such as aluminum is applied to the insulating layer 17 and patterned to form the metal wires 19g, 19d, and 19s, respectively, so as to obtain the MOS transistor 20 as shown in FIGS. 17A and 17B.

According to the exemplary embodiment described above, the semiconductor device 1 provides the MOS transistor 20 with high voltage withstand capability. Firstly, the drain and source electrodes D and S can support high voltages owing to the following characteristics:

(1) Double diffused structure wherein the drain and source electrodes D and S have graded doping concentrations; and (2) The first gate layer 9 has outer edges lying on the field oxide layer 15, which is thicker than the first dielectric layer 7.

Further, the gate electrode G also has the ability to support high voltages since the stacked gate structure, i.e., the substrate 1, the first gate layer 9, and the second gate layer 11 stacked one atop another with the gate dielectric layers 7 and 11 sandwiched therebetween, forms a capacitive divider circuit so that the voltage applied to the gate electrode G may be divided among the stacked components.

Figure 24:
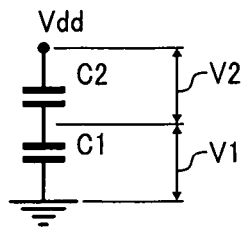
FIG. 24 is a schematic diagram illustrating a capacitive divider circuit included in the semiconductor device of FIG. 17.

Referring to FIG. 24, a schematic diagram illustrating the capacitive divider circuit formed by the gate electrode G is shown.

As shown in FIG. 24, the capacitive divider circuit includes two capacitors connected in series, where "Vdd" represents drive voltage applied to the gate electrode G, "C1" represents capacitance between the semiconductor substrate 1 and the first gate layer 9, and "C2" represents capacitance between the first gate layer 9 and the second gate layer 13, respectively. The gate voltage Vdd is divided into a first voltage V1 applied across the semiconductor substrate 1 and the first gate layer 9 and a second voltage V2 applied across the first gate layer 9 and the second gate layer 13, which can be expressed by the following equations 1 and 2:

$$V1 = [C2/(C1+C2)]*Vdd \quad \text{[Eq. 1]},$$

and $$V2 = [C1/(C1+C2)]*Vdd \quad \text{[Eq. 2]}.$$

According to the equations 1 and 2, for a constant value of the gate voltage Vdd, the first and second voltages V1 and V2 vary as the ratio of the first and second capacitances C1 and C2 varies. Table 1 provides values of V1 and V2 varying with the capacitance ratio C2/C1, calculated in volts assuming Vdd=28 V.

TABLE 1

V1 and V2 for various values of C2/C1

| C2/C1 | V1 | V2 |
|---|---|---|
| 1 | 14 | 14 |
| 2 | 18.6 | 9.3 |
| 3 | 21 | 7 |
| ½ | 9.3 | 18.6 |
| ⅓ | 7 | 21 |

As clearly seen in Table 1, when C1=C2, the voltage V1 supported by the first dielectric layer 7 is half the drive voltage Vdd applied to the gate electrode G. The first voltage V1 reduced by half from Vdd allows the first dielectric layer 7 to be thinner than that would be required when the stacked gate structure were not provided. This means that the gate electrode G can support high voltages without having a thick gate dielectric layer produced through lengthy heat treatments.

Hence, the capacitive divider circuit formed by the gate electrode G is designed so that the second capacitance C2 may be lower than the first capacitance C1. For example, assuming C2 is one third of C1, only 7 V is to be supported by the first dielectric layer 7 even when the drive voltage Vdd is as high as 28 V. To achieve a desired value of the first voltage V1, the amplitude of the second voltage V2 as well as the capacitance ratio C2/C1 may be controlled by changing configurations of the second dielectric layer 11 in relation to the first dielectric layer 7.

For example, it is possible to form the second dielectric layer 11 as an oxide-nitride-oxide (ONO) stack including a silicon nitride layer sandwiched between silicon dioxide layers in place of a single layer of silicon dioxide. Using an ONO dielectric between the first and second gate layers 9 and 13 can increase the second voltage V2 relative to the voltage V1 because the ONO structure, having a high dielectric strength compared to a silicon dioxide monolayer, can support a large portion of the voltage Vdd applied to the gate electrode G. In addition, as the first dielectric layer 7 is formed of silicon oxide material, forming the second dielectric layer 11 of ONO material, in principle, does not involve undesired changes in electrical properties due to hot carrier effects.

Figure 25A:
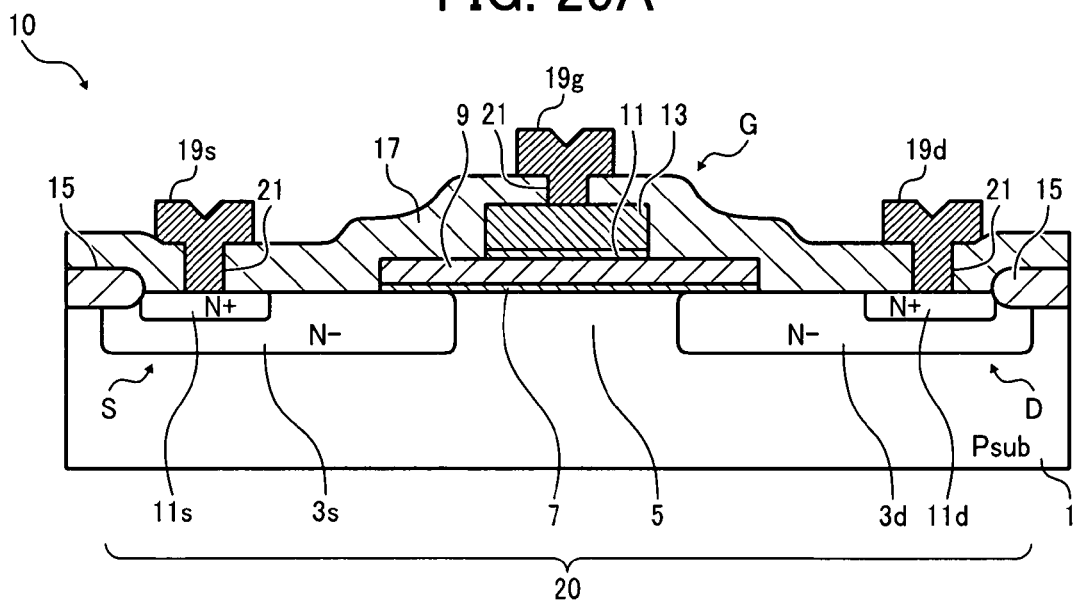
FIGS. 25A and 25B are cross-sectional and plan diagrams, respectively, schematically illustrating an example of the semiconductor device of FIG. 17.
Figure 25B:
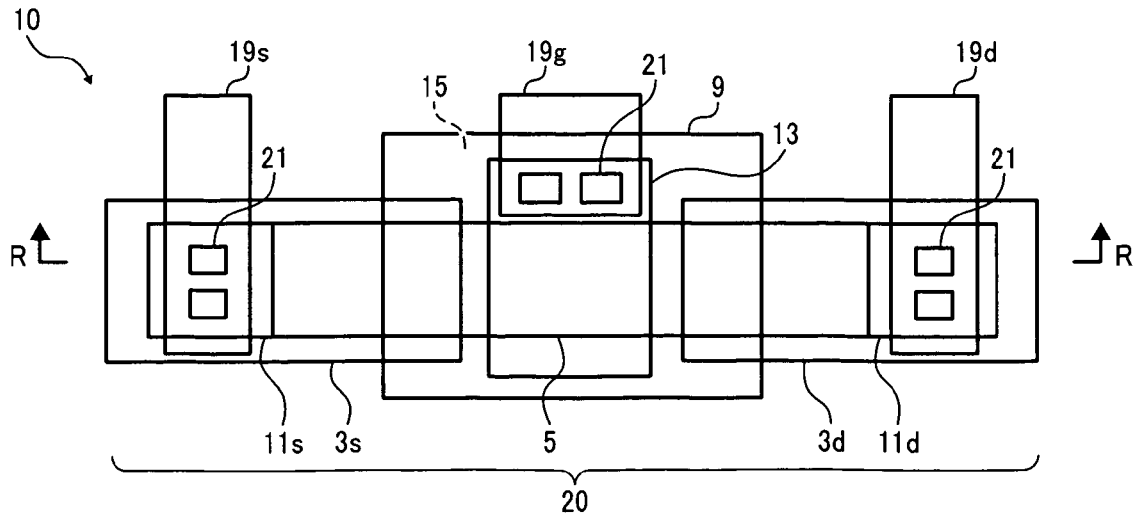

Further, the capacitance ratio C2/C1 may be controlled by modifying the surface area of the second dielectric layer 11 and the second gate layer 13 relative to that of the first dielectric layer 7 and the first gate layer 9. Referring to FIGS. 25A and 25B, schematic diagrams illustrating an example of the semiconductor device 10 wherein the surface area of the second dielectric layer 11 and the second gate layer 13 is modified are shown. FIG. 25B provides a plan view, and FIG. 25A provides a cross-sectional view taken along line R-R of FIG. 25B.

As shown in FIGS. 25A and 25B, the gate electrode G may be configured so that the second dielectric layer 11 and the second gate layer 13 have a surface area substantially smaller than that the first dielectric layer 7 and the first gate layer 9. Reducing the surface area of the second gate layer 13 reduces the second capacitance C2, which may contribute to a further reduction of the voltage V1 applied across the first dielectric layer 7.

Additionally, modifying the thickness of the second dielectric layer 11 relative to the first dielectric layer 7 may also control the capacitance ratio C2/C1.

Referring now to FIGS. 26A and 26B, schematic diagrams illustrating an example of the semiconductor device 10 produced through the fabrication process of FIGS. 18 through 23 are shown. FIG. 26B provides a plan view, and FIG. 26A provides a cross-sectional view taken along line S-S of FIG. 26B.

As shown in FIGS. 26A and 26B, the semiconductor device 10 obtained by the above fabrication process may contain a residue of polycrystalline silicon 23 on the side edges of the first gate layer 9 (shown as dotted in FIG. 26B). The polysilicon residue 23 is left in the process of forming the second gate layer 13 on the second dielectric layer 11, in which the polycrystalline silicon layer is anisotropically dry etched and patterned over the dielectric film previously formed on the semiconductor surface. Thus, the polysilicon residue 23 is separated from the adjoining first gate layer 9 and the underlying doped regions 3d and 3s by a thin film of dielectric material used to form the second dielectric layer 11. The polysilicon residue is also isolated from the second gate layer 13 by the insulating layer 17. Accordingly, the formation of the polysilicon residue 23 does not electrically affect the transistor performance.

Figure 27:
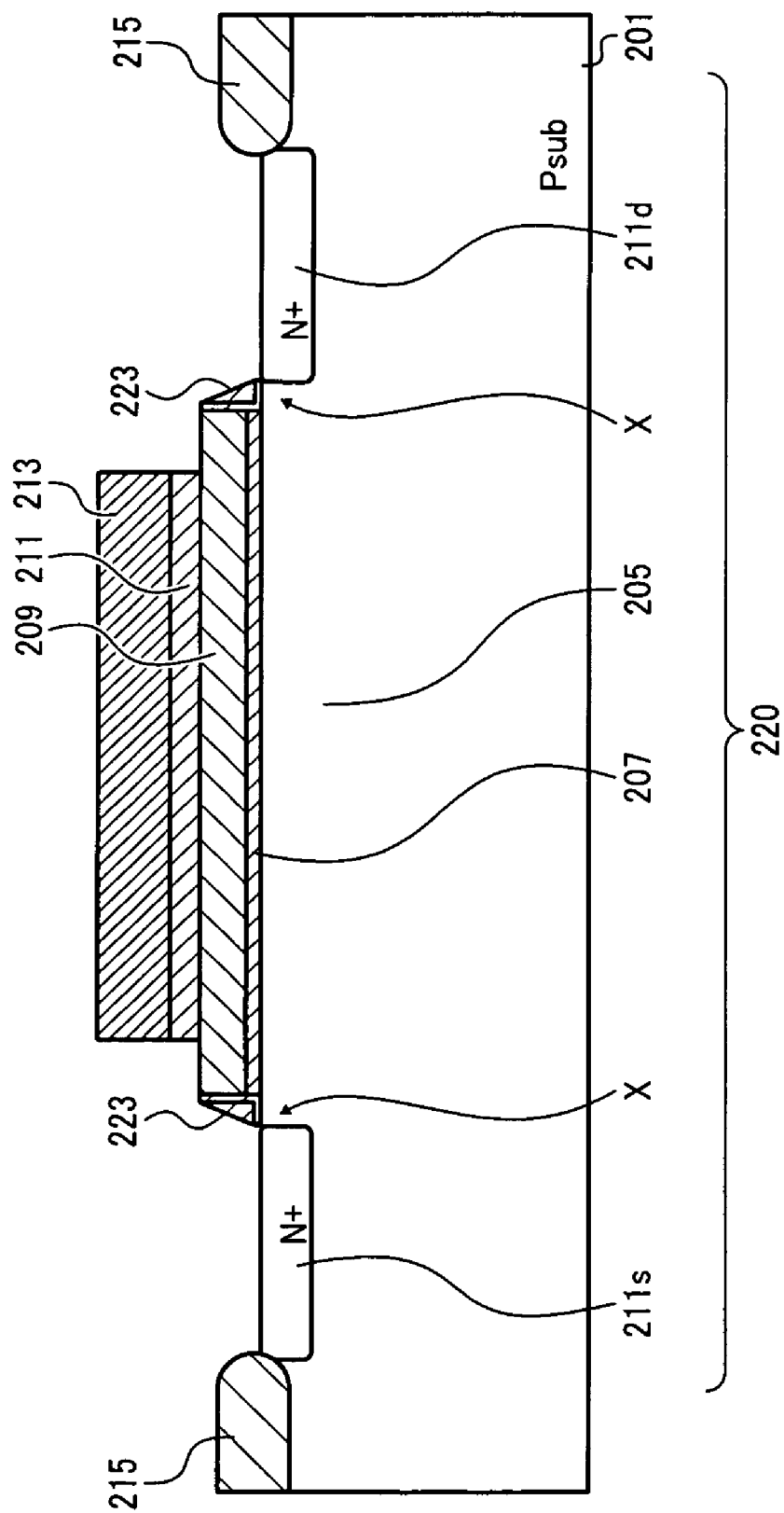
FIG. 27 is a schematic diagram illustrating an example of an NMOS transistor.

Referring to FIG. 27, a schematic diagram illustrating an example of an NMOS transistor 220 provided with a stacked-gate structure but not with a double-diffused drain/source is shown.

As shown in FIG. 27, the MOS transistor 220 includes N+ drain and source regions 211d and 211s defining a channel region 205 therebetween, stacked gate layers 209 and 213, and dielectric layers 207 and 211, which are formed on an active region defined by a field oxide layer 215 in a semiconductor substrate 201. The MOS transistor 220 may be prepared through a like procedure as in FIGS. 18 through 23 and contain a residue of polycrystalline silicon 223 on the side edges of the first gate layer 209. Since the polysilicon residue 223 remains on the side edges of the first gate layer 209 during the fabrication process, the drain and source regions 211d and 211s formed by ion implantation do not extend beneath the polysilicon residue 223 (indicated by X in the drawing), and are spaced from the first gate layer 209, making the MOS transistor 220 inoperable. Therefore, the fabrication process of FIGS. 18 through 23 is preferably used for producing a MOS transistor incorporating a double-diffused drain/source structure.

Figure 28A:
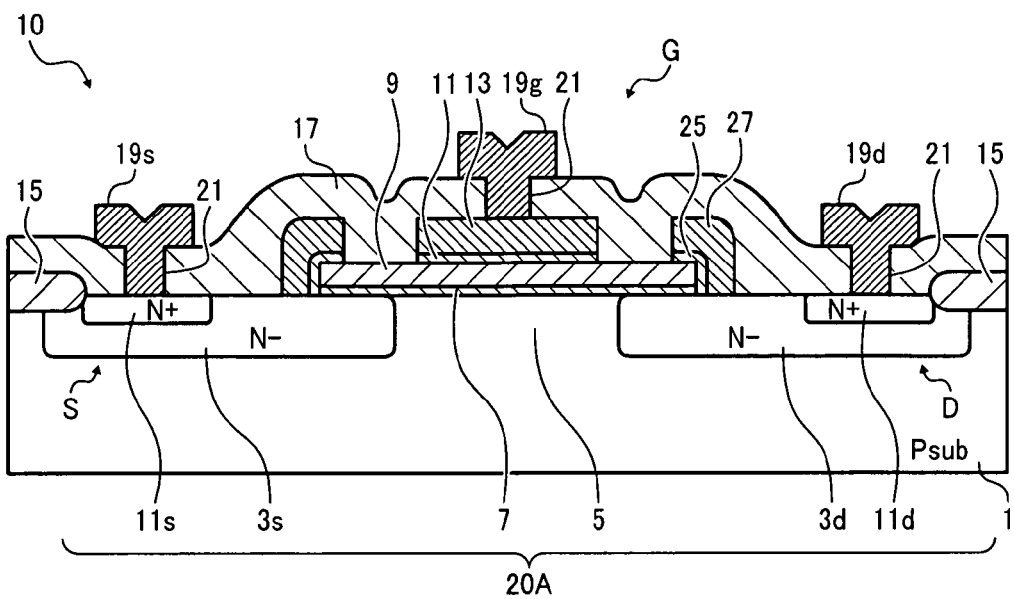
FIGS. 28A and 28B are cross-sectional and plan diagrams, respectively, schematically illustrating the semiconductor device according to another exemplary embodiment of this disclosure.
Figure 28B:
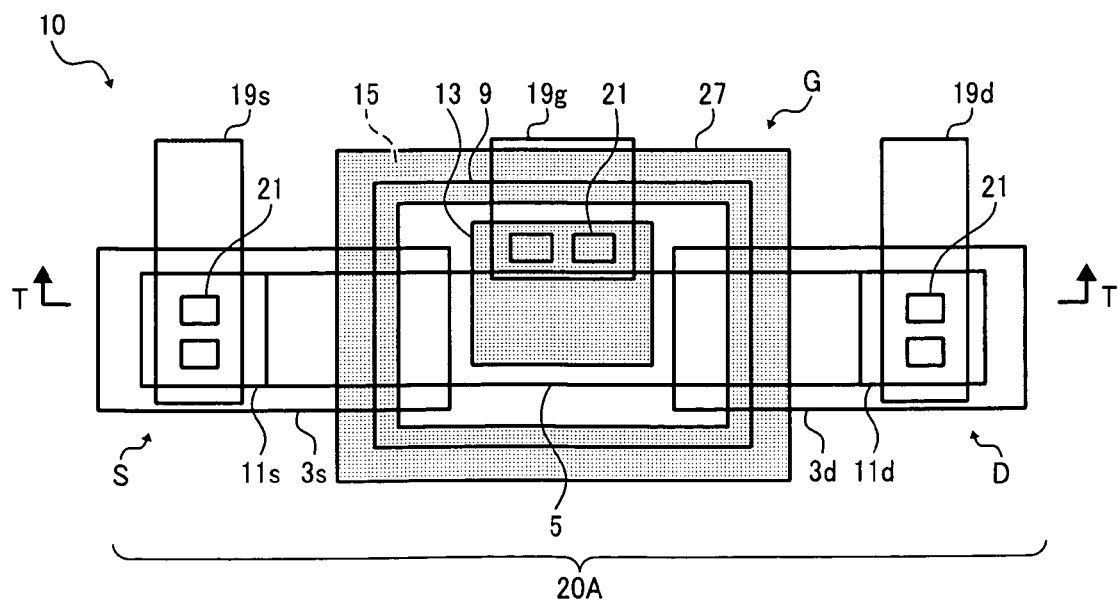

Referring now to FIGS. 28A and 28B, schematic diagrams illustrating the semiconductor device 10 according to another exemplary embodiment of this disclosure are shown. FIG. 28B provides a plan view, and FIG. 28A provides a cross-sectional view taken along line T-T of FIG. 28B.

As shown in FIGS. 28A and 28B, the semiconductor device 10 of this embodiment includes an MOS transistor 20A configured in a manner similar to that of the MOS transistor 20, except that the MOS transistor 20A further includes a dielectric pattern 25 and a polycrystalline silicon pattern 27. The dielectric pattern 25 and the polycrystalline silicon layer 27 are stacked one atop another on the side edges of the first gate layer 9, and are spaced from the second dielectric layer 11 and the second gate layer 13. The dielectric pattern 25 is formed simultaneously with and of the same material as the second dielectric layer 11, and the polycrystalline silicon layer 27 is formed simultaneously with and of the same material as the second gate layer 13. The polycrystalline silicon layer 27 is isolated from the second gate layer 13 by the insulating layer 17, so that the voltage applied to the second gate layer 13 does not operate on the first dielectric layer 7 via the polycrystalline silicon layer 27, that is, the high voltage withstand capability is not affected.

According to this embodiment (FIGS. 28A and 28B), the polycrystalline silicon layer 27 covers the side edges of the first gate layer 9 to avoid the formation of the polysilicon residue 23 thereon. Although not susceptible to affect the electrical performance of the semiconductor device 1, the formation of the polycrystalline silicon residue may be preferably avoided. This is because the polysilicon residue may cause defects such as short-circuits when occasionally coming off during the device fabrication, and can reduce yield rates in the semiconductor manufacture process.

Figure 29A:
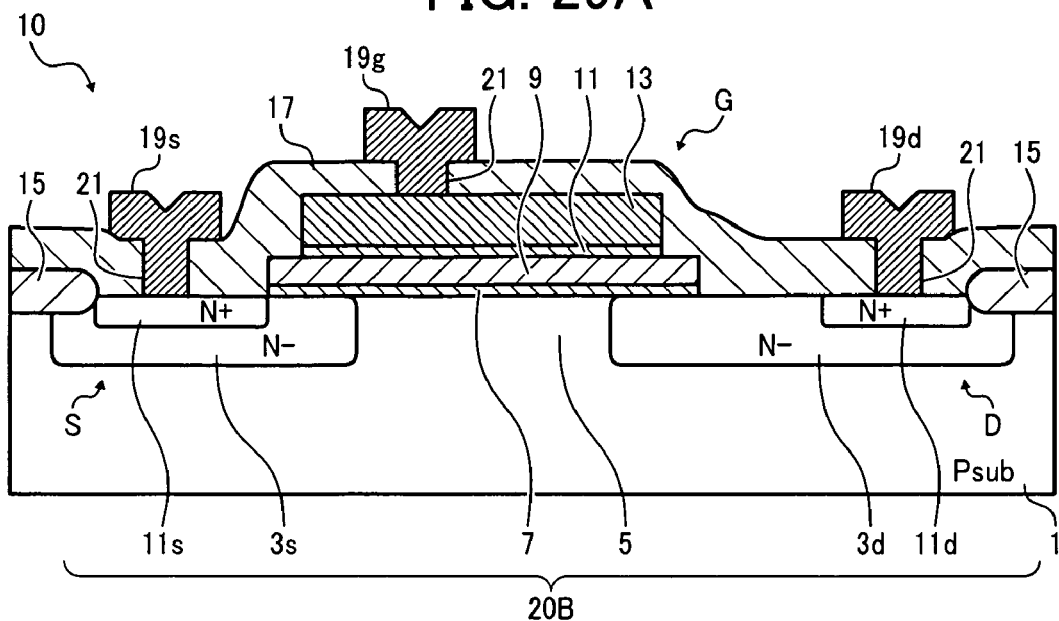
FIGS. 29A and 29B are cross-sectional and plan diagrams, respectively, schematically illustrating the semiconductor device according to still another exemplary embodiment of this disclosure.
Figure 29B:
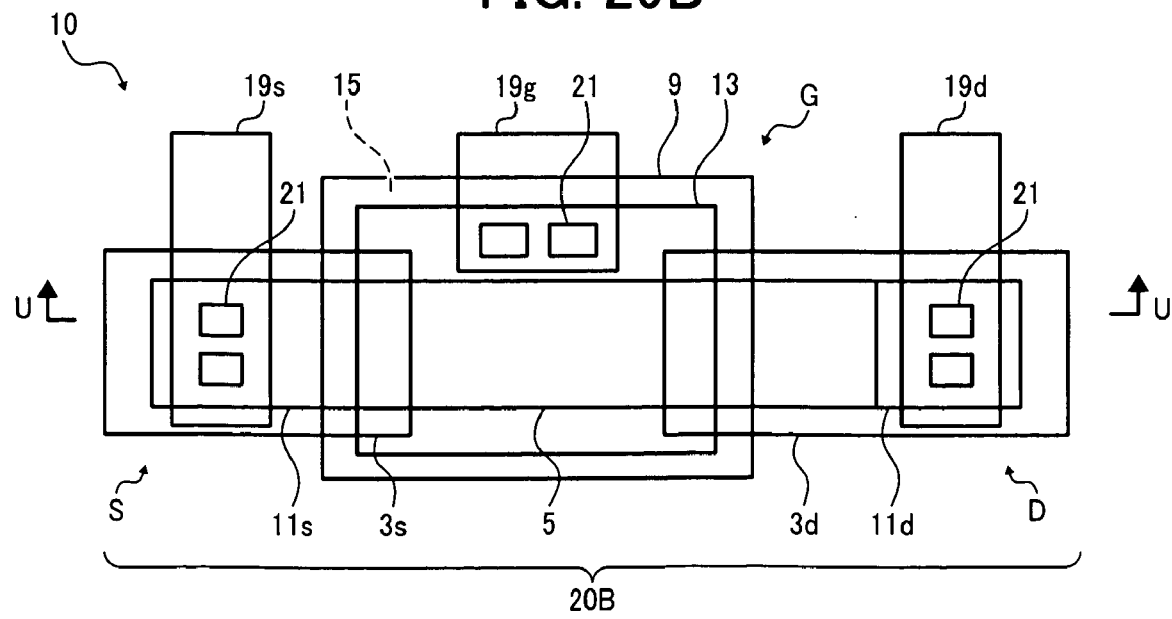

Referring to FIGS. 29A and 29B, schematic diagrams illustrating the semiconductor device 10 according to another exemplary embodiment of this disclosure are shown. FIG. 29B provides a plan view, and FIG. 29A provides a cross-sectional view taken along line U-U of FIG. 29B.

As shown in FIGS. 29A and 29B, the semiconductor device 10 of this embodiment includes an MOS transistor 20B configured in a manner similar to the MOS transistor 20, except that the N+ source region 11$s$ is located adjacent the first gate layer 9 while the N+ drain region 11$d$ is located away from the first gate layer 9.

Figure 30A:
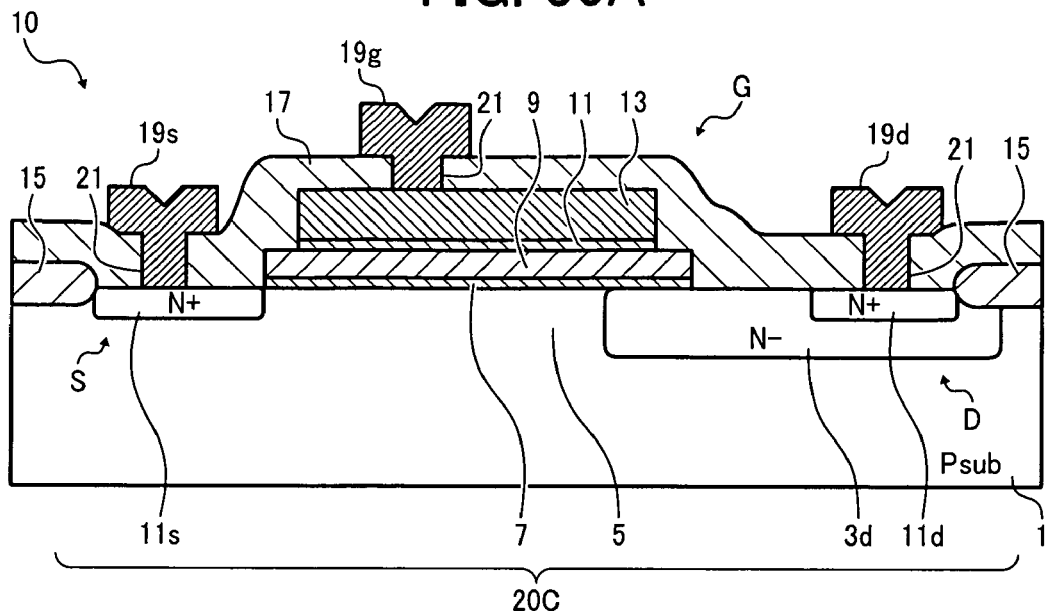
FIGS. 30A and 30B are cross-sectional and plan diagrams, respectively, schematically illustrating the semiconductor device according to still another exemplary embodiment of this disclosure.
Figure 30B:
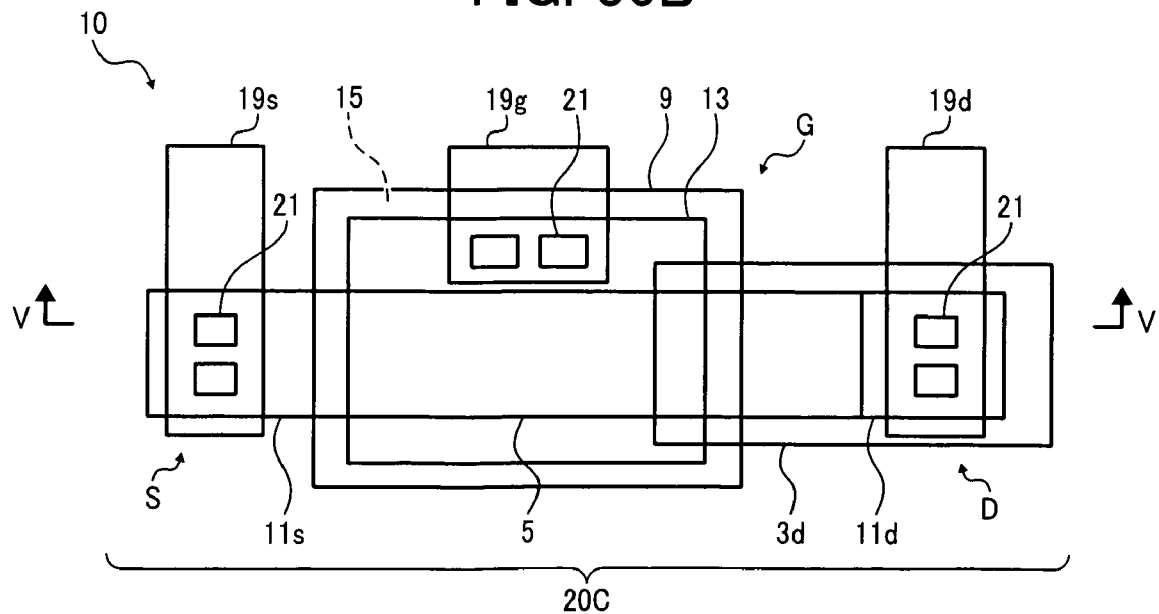

Referring to FIGS. 30A and 30B, schematic diagrams illustrating the semiconductor device 10 according to another exemplary embodiment of this disclosure are shown. FIG. 30B provides a plan view, and FIG. 30A provides a cross-sectional view taken along line V-V of FIG. 30B.

As shown in FIGS. 30A and 30B, the semiconductor device 10 of this embodiment includes an MOS transistor 20C configured in a manner similar to the MOS transistor 20, except that the source electrode S does not include the lightly doped region 3$s$ and only the drain electrode D incorporates the double-diffused structure.

The exemplary embodiments shown in FIGS. 25A through 26B as well as the exemplary embodiments shown in FIGS. 28A through 30B may be fabricated in a manner similar to that described in connection with FIGS. 18A through 23B, in which the layout of components may be controlled by modifying computer aided design (CAD) data used in photolithographic processes.

Figure 31:
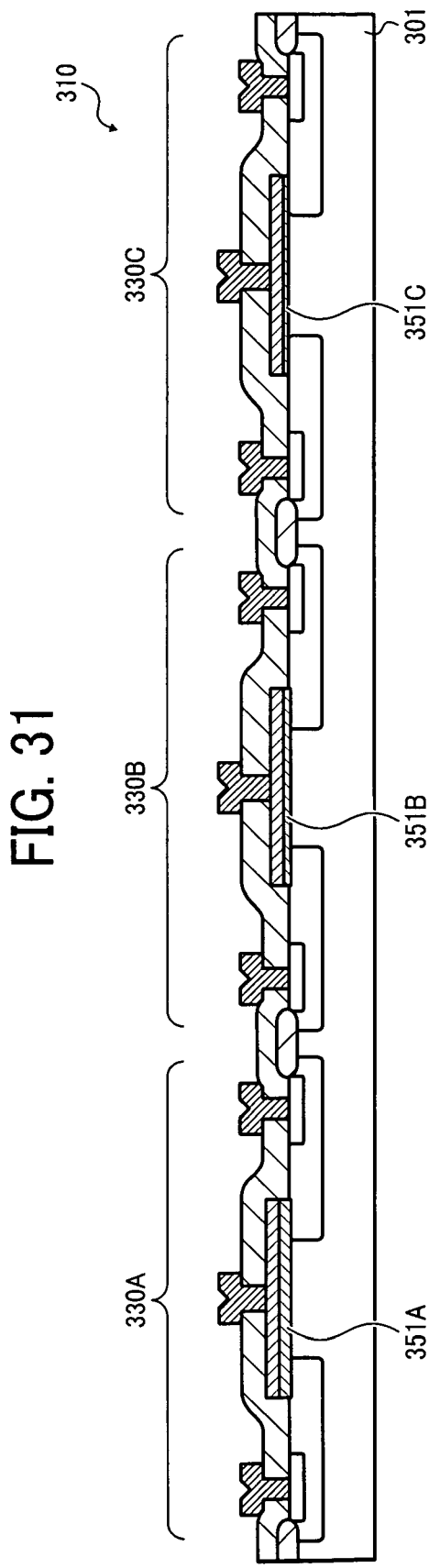
FIG. 31 is a schematic diagram illustrating an example of a semiconductor device.

Referring now to FIG. 31, a schematic diagram illustrating an example of a semiconductor device 310 in which multiple masked-LDD transistors are constructed on a single semiconductor substrate is shown.

As shown in FIG. 31, the semiconductor device 310 includes masked-LDD transistors 330A, 330B, and 330C, which are generally configured in a similar manner on a single semiconductor substrate 301, but have gate dielectric layers of different thicknesses 351A, 351B, and 351C, respectively, so as to accommodate different gate voltages applied thereto. For example, when the transistors 330A, 330B, and 330C operate at voltages 30 V, 22.5 V, and 15 V, respectively, the thickness of each gate dielectric layer should be 80 nm for the layer 351A, 50 nm for the layer 351B, and 30 nm for the layer 351C, respectively. The need to form the gate dielectric layers in different thicknesses on the same substrate causes various problems, such as lengthy process time, increased number of masking patterns used for photolithography, deformation of components during the fabrication (e.g., recesses appearing on the surface of field oxide). The semiconductor device 1 according to this disclosure may be applied to fabricate multiple masked-LDD transistors on a single semiconductor chip without causing such problems.

Referring to FIGS. 32A and 32B, schematic diagrams illustrating the semiconductor device 10 according to another exemplary embodiment of this disclosure are shown. FIG. 32B provides a plan view, and FIG. 32A provides a cross-sectional view taken along line W-W of FIG. 32B.

As shown in FIGS. 32A and 32B, the semiconductor device 10 includes different MOS transistors 30A, 30B, and 30C, constructed on the same substrate 1. The transistors 30A, 30B, and 30C are configured in a manner similar to that of the MOS transistor 10, and are operable at specific drive voltages Vdd, 30 V for the transistor 30A, 22.5 V for the transistor 30B, and 15V for the transistor 30C.

The transistors 30A, 30B, and 30C have substantially identical properties in terms of dimensions and/or doping concentrations of the well region, the first dielectric layer 7, the first gate layer 9, and the second dielectric layer 11, and only differ in the surface areas of the second gate layer 13A, 13B, and 13C and the corresponding second dielectric layers 11A, 11B, and 11C. Accordingly, the transistors 30A, 30B, and 30C exhibit a substantially identical value for the capacitance C1, (i.e., the capacitance between the semiconductor substrate 1 and the first gate layer 9), but the capacitance C2 (i.e., the capacitance between the first gate layer 9 and the second gate layer 13) differs from one to another due to the different surface areas of the second gate layer and the second dielectric layer. Preferably, the surface areas of the second gate layer 13A, 13B, and 13C are adjusted so that the capacitance ratio C2/C1 may be ⅓ for the transistor 30A, ½ for the transistor 30B, and 1 for the transistor 30C, respectively. Table 2 provides exemplary values of V1 and V2 for the transistors 30A, 30B, and 30C, calculated in volts according to the equations [1] and [2] with the specific drive voltages Vdd.

TABLE 2

V1 and V2 for the transistors 30A, 30B, and 30C

|  | Transistor 30A | Transistor 30B | Transistor 30C |
|---|---|---|---|
| Vdd | 30 | 22.5 | 15 |
| C2/C1 | ⅓ | ½ | 1 |
| V1 | 7.5 | 7.5 | 7.5 |
| V2 | 22.5 | 15 | 7.5 |

As shown in Table 2, when the transistors 30A, 30B, and 30C operate at the different drive voltages Vdd, the capacitance ratio C2/C1 correspondingly modified causes the voltage V1 applied to the first dielectric layer 7 to be identical (i.e., 7.5 V) for the transistors 30A, 30B, and 30C. Thus, the semiconductor device 10 may be effectively implemented as a large scale integrated (LSI) system, wherein multiple transistors fabricated with equally configured gate dielectric layers on a single chip may operate at different drive voltage levels.

In addition, the transistors 30A, 30B, and 30C may be fabricated in a manner similar to that described in connection with FIGS. 18 through 23, in which the layout of components may be controlled by modifying CAD data used in photolithographic processes. This facilitates the fabrication of a semiconductor device having multiple transistors operating at different drive voltages, while avoiding various problems resulting from forming gate dielectric layers in different thicknesses on a single substrate.

Although in the above exemplary embodiment (FIGS. 32A and 32B), the transistors 30A, 30B, and 30C operable at different drive voltages are obtained by varying the surface area of the second gate layers 13A, 13B, and 13C, it is possible to control the drive voltage Vdd by modifying the dimensions and/or material of the elements of the gate electrode G (i.e., the first dielectric layer 7, the first gate layer 9, the second dielectric layer 11, and the second gate layer 13) of the multiple transistors 30A, 30B, and 30C. However, it may be advantageous to only vary the surface area of the second gate layers 13A, 13B, and 13C, so as to avoid the problems resulting from forming the gate dielectric layers in different thicknesses on a single substrate.

Further, although the transistors 30A, 30B, and 30C described above are arranged to support relatively high voltages (i.e., greater than 15 V), this exemplary embodiment (FIGS. 32A and 32B) may also be applied to fabricating multiple transistors that are operable at relatively small, different voltages such as 2.5 V.

Figure 33:
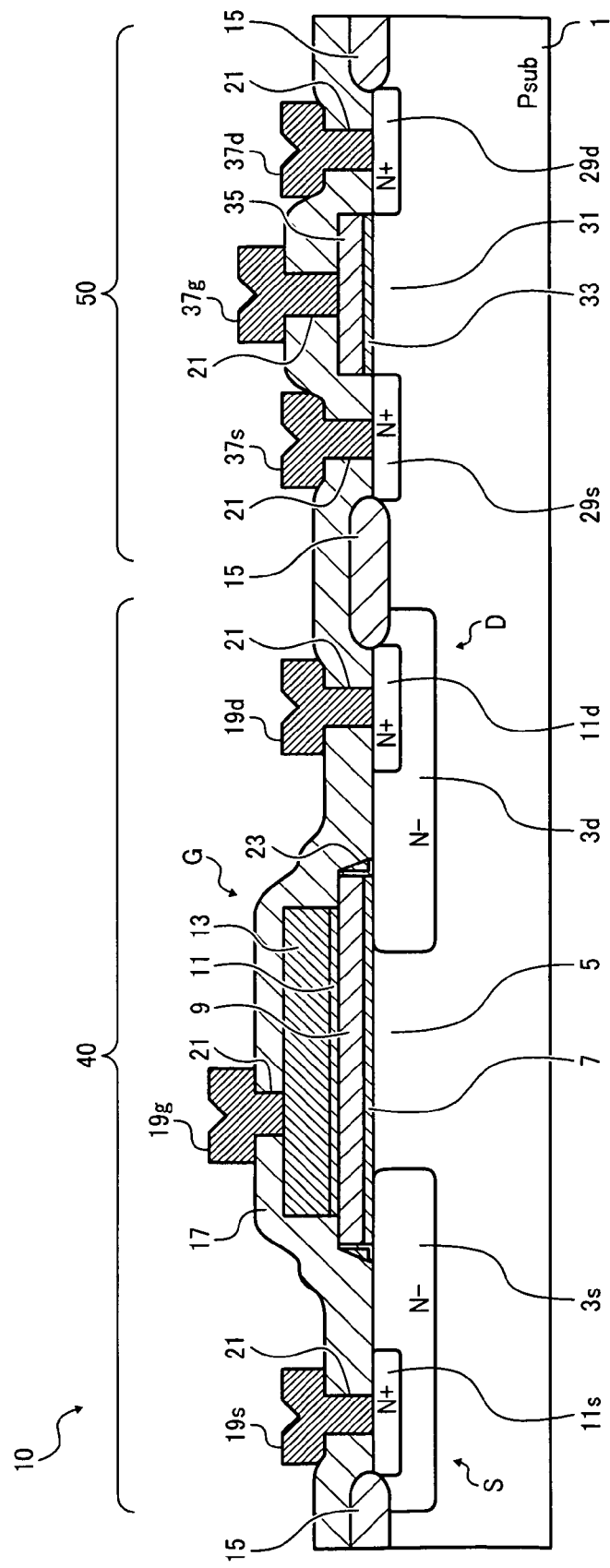
FIG. 33 is a cross-sectional diagram schematically illustrating the semiconductor device according to still another exemplary embodiment of this disclosure.

Referring now to FIG. 33, a cross-sectional diagram schematically illustrating the semiconductor device 10 according to another exemplary embodiment of this disclosure is shown.

As shown in FIG. 33, the semiconductor device 10 of this exemplary embodiment includes a masked-LDD transistor 40 and a non-masked LDD transistor 50 constructed at different portions on the single semiconductor substrate 1. The transistor 40 is configured in a manner similar to that of the MOS transistor 20 while the transistor 50 has a structure different from that of the transistor 40.

The transistor 50 includes N+ drain and source regions 29d and 29s in the semiconductor substrate 1, located apart from each other in a p-type well, not shown, and defining a channel region 31 therebetween. The transistor 50 further includes a gate dielectric layer 33 and a gate electrode 35 stacked one atop another on the channel region 31. The gate dielectric layer 33 is formed simultaneously with and of the same material as the gate dielectric layer 33, and may be a silicon oxide layer of a thickness of approximately 20 nm, for example. The gate electrode 35 is formed simultaneously with and of the same material as the first gate layer 9.

Further, the insulating layer 17 extends over the gate electrode 35 and the N+ drain and source regions 29d and 29s with the via holes 21 penetrating therethrough to connect the gate electrode 35 to a gate wire 37g, the drain region 29d to a drain wire 37d, and the source region 29s to a source wire 37s, respectively. The wires 37g, 37d, and 37s are formed of metal and extend across the insulating layer 17.

Referring now to FIGS. 34 through 39, cross sectional diagrams schematically illustrating fabrication process of the semiconductor device 10 of FIG. 33 are shown.

Figure 34:
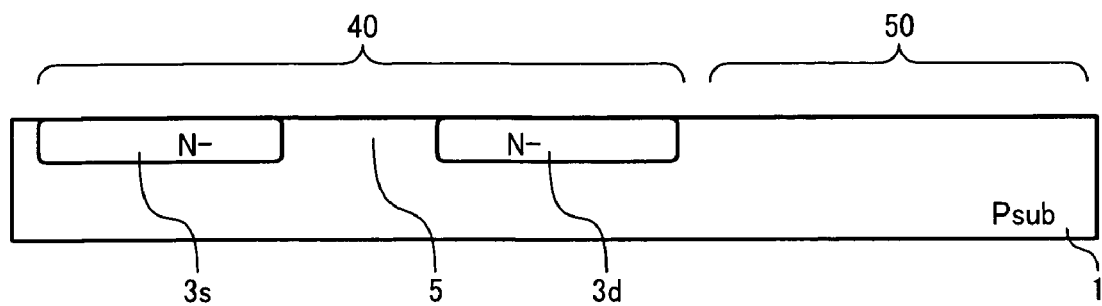
FIGS. 34 through 39 are cross sectional diagrams schematically illustrating a fabrication process for the semiconductor device of FIG. 33.

Referring to FIG. 34, after the p-well, not shown, is formed in the semiconductor substrate 1, a photolithographic process is performed to develop a photoresist pattern masking the surface of the semiconductor substrate 1. The semiconductor substrate 1 is then subjected to phosphorous ion implantation with a dose of approximately $2.0*10^{13}$ ions/cm$^2$ at an energy of approximately 100 KeV. The resist pattern is removed, and the implanted ions are diffused and activated under nitrogen atmosphere at approximately 1000° C. for approximately 30 minutes to form the lightly doped first drain and source regions 3d and 3s.

Figure 35:
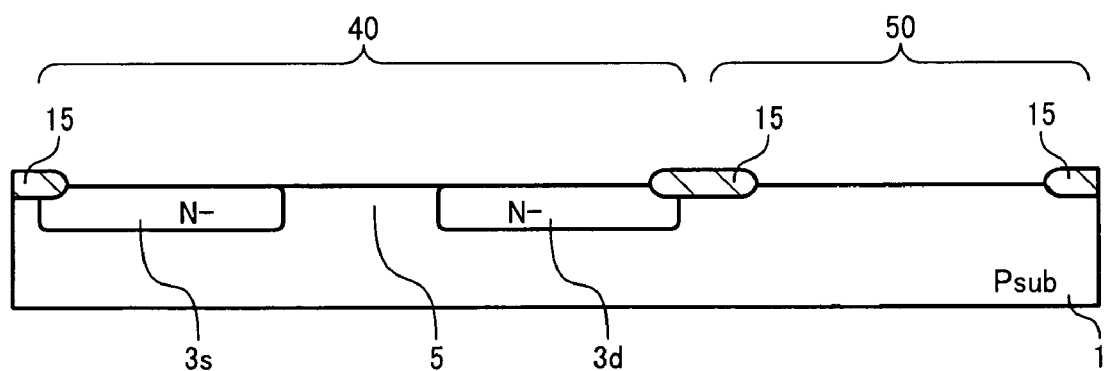

Then, the field oxide layer 15 is grown to a thickness of approximately 500 nm using a suitable LOCOS insulation technique as shown in FIG. 35.

Figure 36:
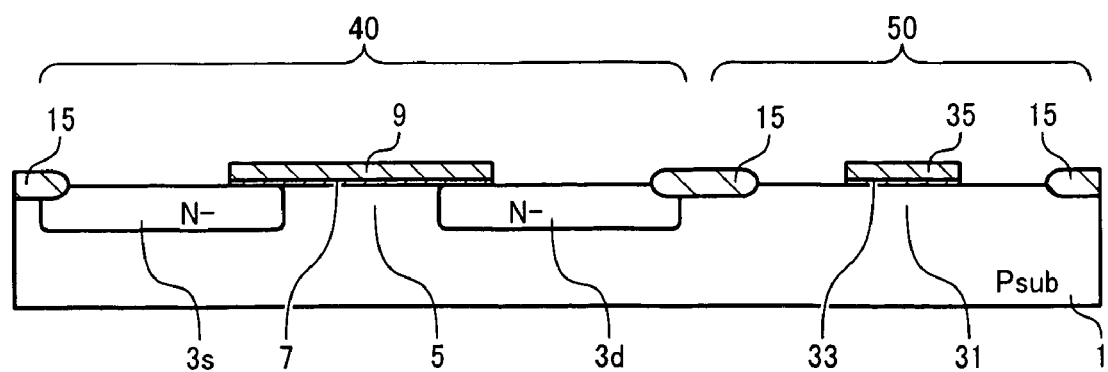

After forming the field oxide layer 5, a dielectric layer of a thickness of approximately 20 nm is formed on the semiconductor substrate 1, and subsequently a polycrystalline silicon layer is formed thereon to a thickness of approximately 300 nm. Then, a photoresist mask is formed through photolithographic process to anisotropically dry etch the polycrystalline silicon layer and to anisotropically dry or wet etch the dielectric film. With reference to FIG. 36, this etching is sequentially performed to obtain the first gate layer 9 and the first dielectric layer 7 stacked together as well as the gate electrode 35 and the gate dielectric layer 33 stacked together, after which the masking photoresist is removed.

Figure 37:
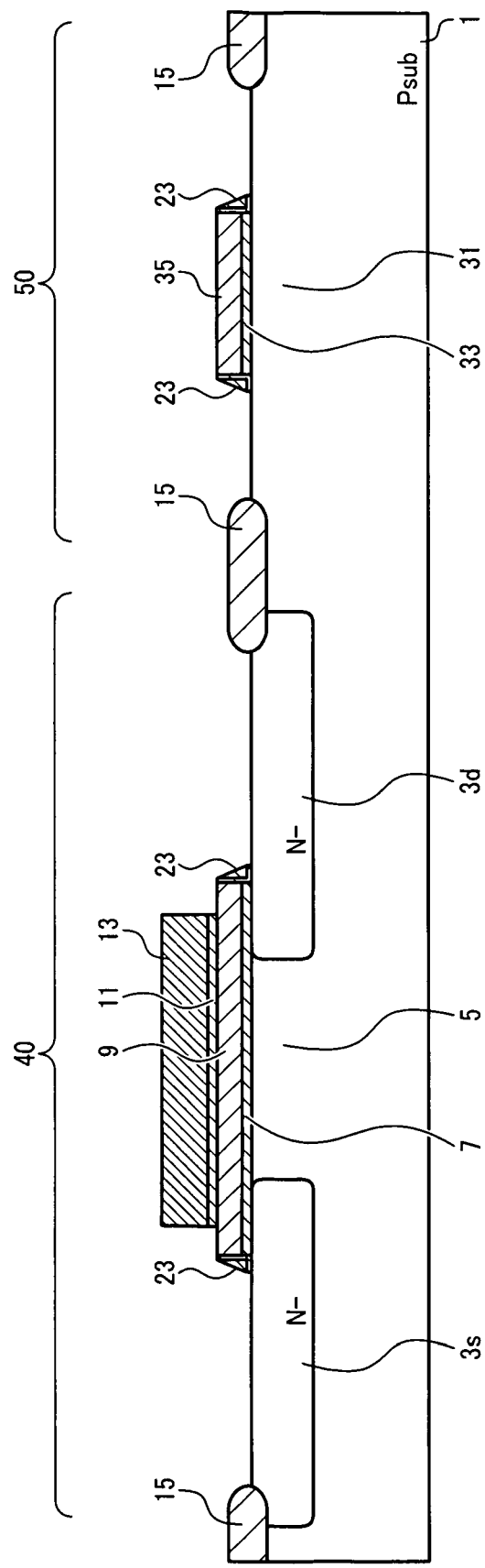

Then, a dielectric layer of a thickness of approximately 20 nm is formed on the first gate layer 9, and subsequently a polycrystalline silicon layer is formed thereon to a thickness of approximately 300 nm. Then, a photoresist mask is formed through photolithographic process to anisotropically dry etch the polycrystalline silicon layer and to anisotropically dry or wet etch the dielectric film. With reference to FIG. 37, this etching is sequentially performed to obtain the second gate layer 13 and the second dielectric 11 stacked together, after which the masking photoresist is removed. During the etching process, the polycrystalline silicon residue 23 is left on the side edges of the first gate layer 9 and the gate electrode 35 as shown in the drawing.

Figure 38:
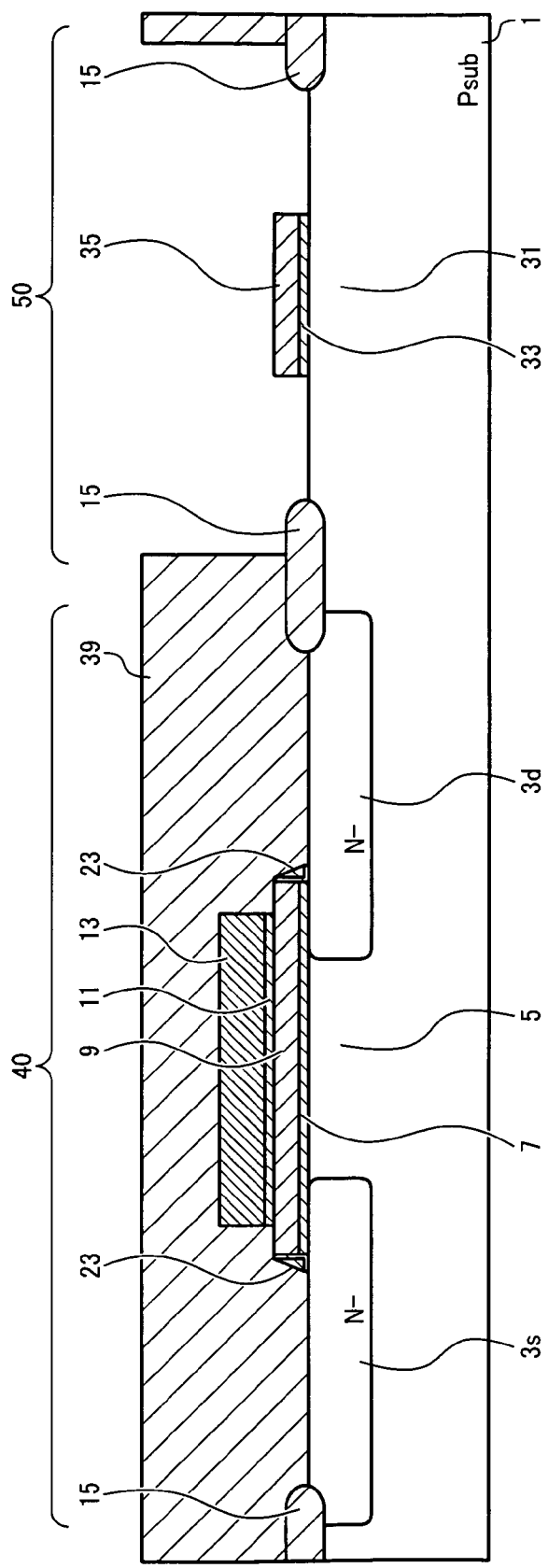

Thereafter, a resist pattern 39 is formed to cover the semiconductor substrate 1 with an opening exposing the active region of the transistor 50. The semiconductor substrate 1 thus masked is subjected to etch process, such as isotropic etching, to remove the polysilicon residue 23 from the side edges of the gate electrode 35 as shown in FIG. 38.

Figure 39:
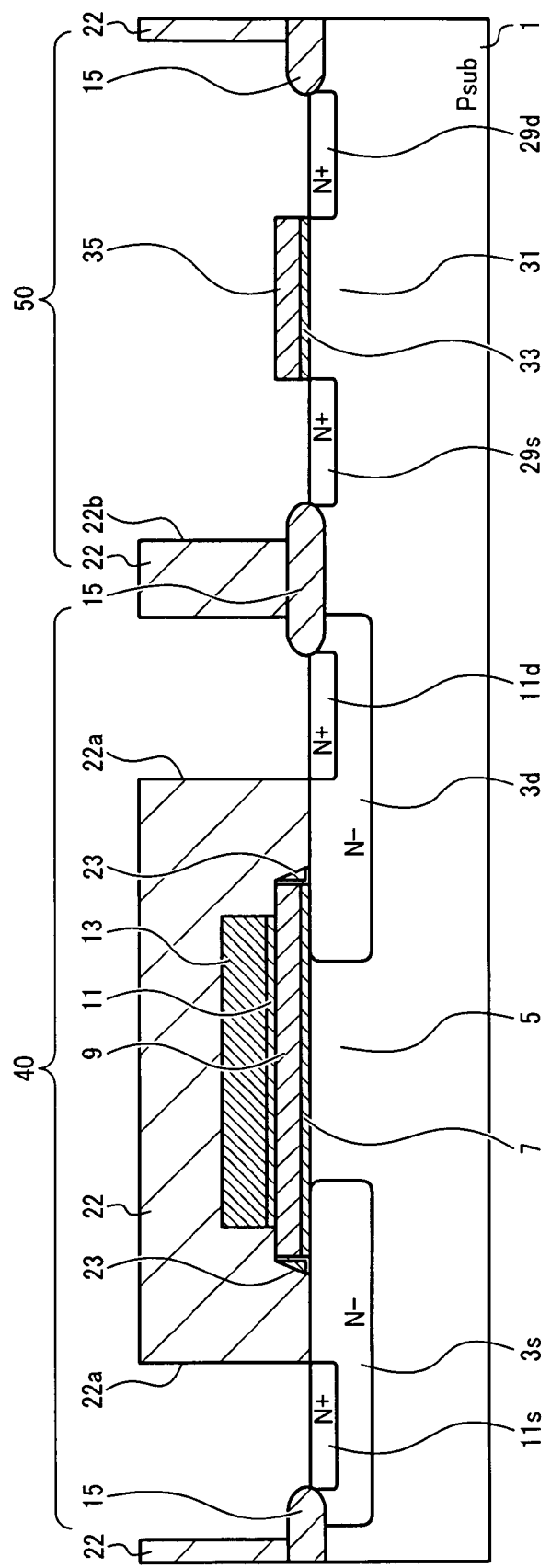

Subsequently, another resist pattern 22 is formed to cover the semiconductor substrate 1 with openings 22a exposing portions of the doped regions 3d and 3s and an opening 22b exposing the active region of the transistor 50. The openings 22a are aligned parallel to the length of the channel region 5 and spaced away from the adjacent edge of the first gate layer 9. The semiconductor substrate 1 thus masked is subjected to arsenic ion implantation at an energy of approximately 30 KeV with a dose of approximately $5.0*10^{15}$ ions/cm$^2$. After removing the masking resist, the implanted ions are diffused and activated under nitrogen atmosphere at approximately 900° C. for approximately 30 minutes to form the N+ drain and source regions 11d and 11s as well as the N+ drain and source regions 29d and 29s as shown in FIG. 39, where the resist pattern 22 removed after ion implantation is shown for the purpose of illustration.

After the ion implantation, a dielectric film of silicon oxide material is formed to a thickness of approximately 1000 nm over an entire area of the semiconductor substrate 1. The dielectric film is etched using a patterned resist mask to obtain the insulating layer 17 with the via holes 21 at portions corresponding to the N+ drain and source regions 11d and 11s, the second gate layer 13, the N+ drain and source regions 29d and 29s, and the gate electrode 35. Thereafter, a layer of suitable metal such as aluminum is applied to the insulating layer 17 and patterned to form the metal wires 19g, 19d, and 19s as well as the metal wires 37g, 37d, and 37s, respectively, so as to obtain the transistors 40 and 50 as shown in FIG. 33.

According to this exemplary embodiment (FIGS. 34 through 39), the non-masked-LDD transistor 50 may be fabricated simultaneously with the masked-LDD transistor 40. Such fabrication is possible because the masked-LDD transistor 40 incorporating the stacked-gate structure does not require a thick dielectric layer to achieve high voltage withstand capability. Thus, as the dielectric layer 7 as well as the first gate layer 9 can be formed simultaneously with and of the same material as the corresponding elements of the transistor 50, the process of integrating high voltage transistors with non-high voltage transistors may be simplified, eliminating various problems resulting from lengthy process time.

Figure 40:
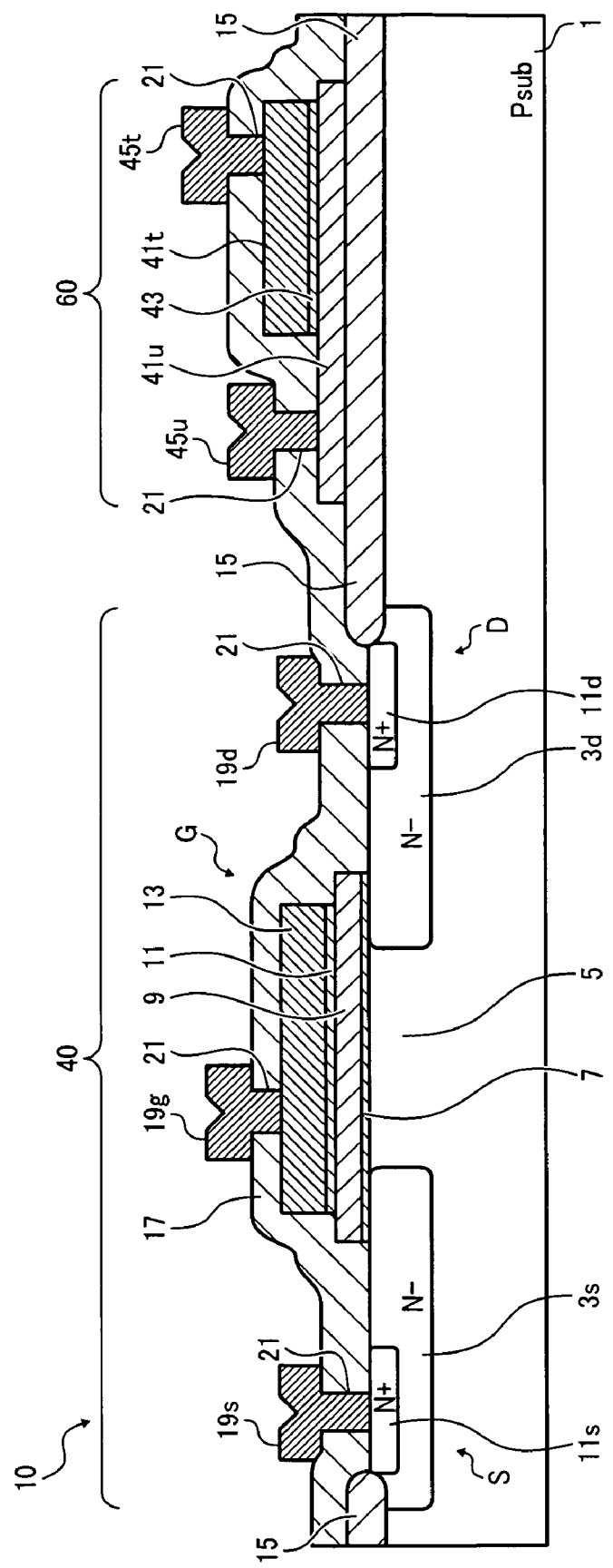
FIG. 40 is a cross-sectional diagram schematically illustrating the semiconductor device according to still another exemplary embodiment of this disclosure.

Referring now to FIG. 40, a cross-sectional diagram schematically illustrating the semiconductor device 10 according to another exemplary embodiment of this disclosure is shown.

As shown in FIG. 40, the semiconductor device 10 of this embodiment includes the masked-LDD transistor 40 and a capacitor 60 constructed at different portions on the single semiconductor substrate 1.

In the semiconductor device 10, the capacitor 60 is formed over the field oxide layer 15. The capacitor 60 includes first and second electrodes 41u and 41t and a dielectric layer 43. The first and second electrodes 41u and 41t are stacked one atop another on the field oxide layer 15, sandwiching the dielectric layer 43 threrebetween. The first electrode 41u is formed simultaneously with and of the same material as the first gate layer 9, the dielectric layer 43 is formed simultaneously with and of the same material as the second dielectric layer 11, and the second electrode 41u is formed simultaneously with and of the same material as the second gate layer 13.

Further, the insulating layer 17 extends over the first and second electrodes 41u and 41t with the via holes 21 penetrating therethrough to connect the first electrode 41u to a metal wire 45u and the second electrode 41t to a metal wire 45t, respectively. The wires 45u and 45t extend across the insulating layer 17, and are formed simultaneously with and of the same material as the wires 19g, 19d, and 19s, respectively.

Referring now to FIGS. 41 through 46, cross-sectional diagrams schematically illustrating fabrication process of the semiconductor device 10 of FIG. 40 are shown.

Figure 41:
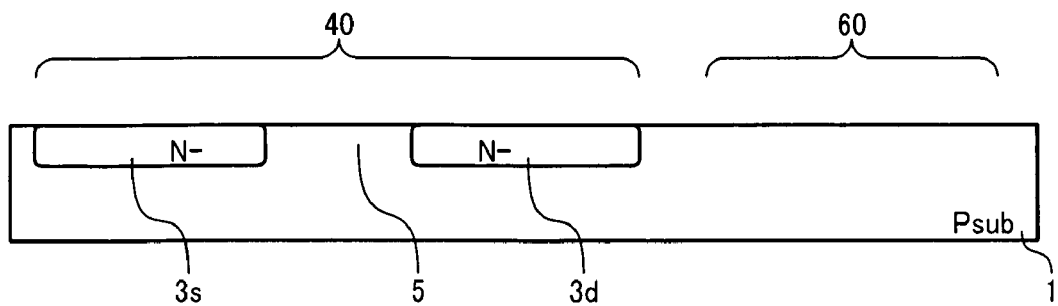
FIGS. 41 through 46 are cross-sectional diagrams schematically illustrating a fabrication process for the semiconductor device of FIG. 40.

Referring to FIG. 41, after the p-well, not shown, is formed in the semiconductor substrate 1, a photolithographic process is performed to develop a photoresist pattern masking the surface of the semiconductor substrate 1. The semiconductor substrate 1 is then subjected to phosphorous ion implantation with a dose of approximately $2.0*10^{13}$ ions/cm$^2$ at an energy of approximately 100 KeV. The resist pattern is removed, and the implanted ions are diffused and activated under nitrogen atmosphere at approximately 1000° C. for approximately 30 minutes to form the lightly doped first drain and source regions 3d and 3s defining the channel region 5.

Figure 42:
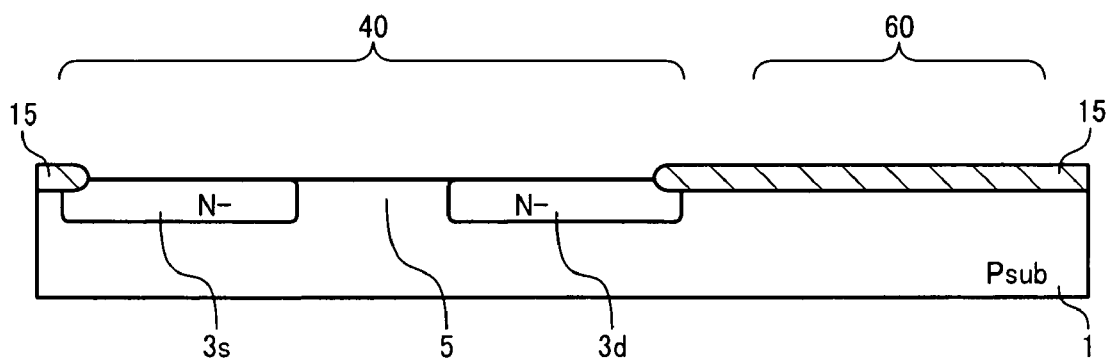

Then, the field oxide layer 15 is grown to a thickness of approximately 500 nm using a suitable LOCOS insulation technique as shown in FIG. 42.

Figure 43:
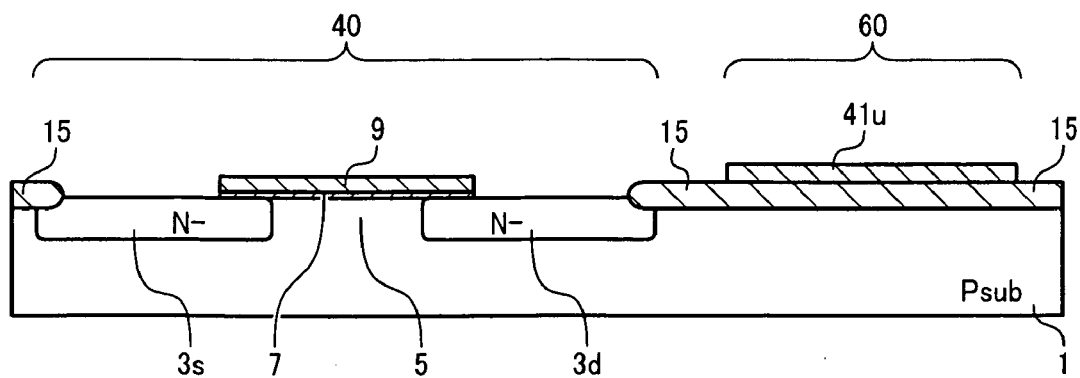

After forming the field oxide layer 15, a dielectric layer of a thickness of approximately 20 nm is formed on the semiconductor substrate 1, and subsequently a polycrystalline silicon layer is formed thereon to a thickness of approximately 300 nm. Then, a photoresist mask is formed through photolithographic process to anisotropically dry etch the polycrystalline silicon layer and to anisotropically dry or wet etch the dielectric film. With reference to FIG. 43, this etching is sequentially performed to obtain, at selected portions on the substrate 9, the first gate layer 9 and the first dielectric layer 7 stacked together, as well as the first electrode 41u and a residue of dielectric material lying below, not shown, after which the masking photoresist is removed.

Figure 44:
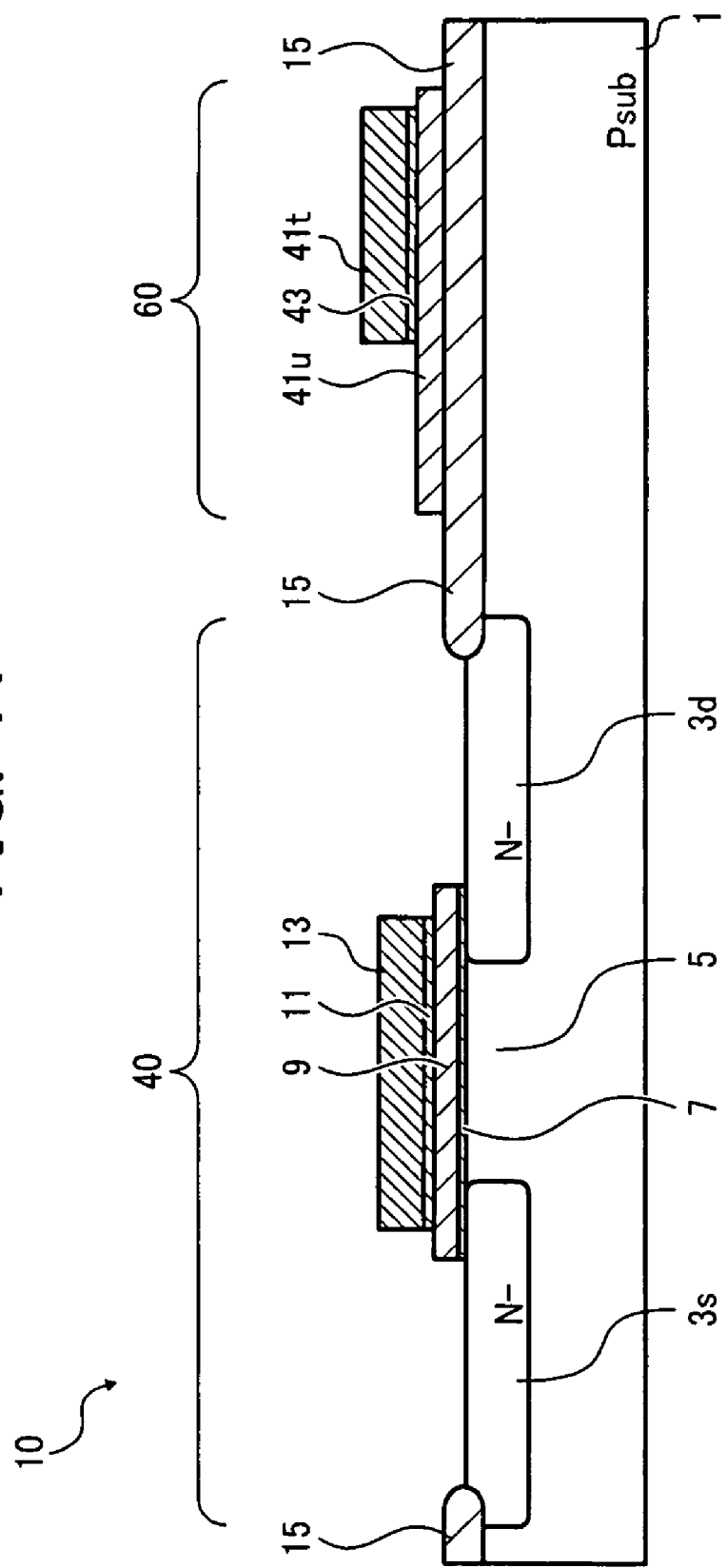

Thereafter, a dielectric layer of a thickness of approximately 20 nm is formed on the first gate layer 9, and subsequently a polycrystalline silicon layer is formed thereon to a thickness of approximately 300 nm. Then, a photoresist mask is formed through photolithographic process to anisotropically dry etch the polycrystalline silicon layer and to anisotropically dry or wet etch the dielectric film. With reference to FIG. 44, this etching is sequentially performed to obtain the second gate layer 13 and the second dielectric 11 stacked together, as well as the second electrode 41t and the dielectric layer 43 stacked together, after which the masking photoresist is removed. During the etching process, the polycrystalline silicon residue 23, not shown, may be left on the side edges of the first gate layer 9 and the first electrode 41u. Even through formed around the first electrode 41u, the polysilicon residue 23 rests on the field oxide layer 15 and therefore does not affect electrical performance of the capacitor 60.

Figure 45:
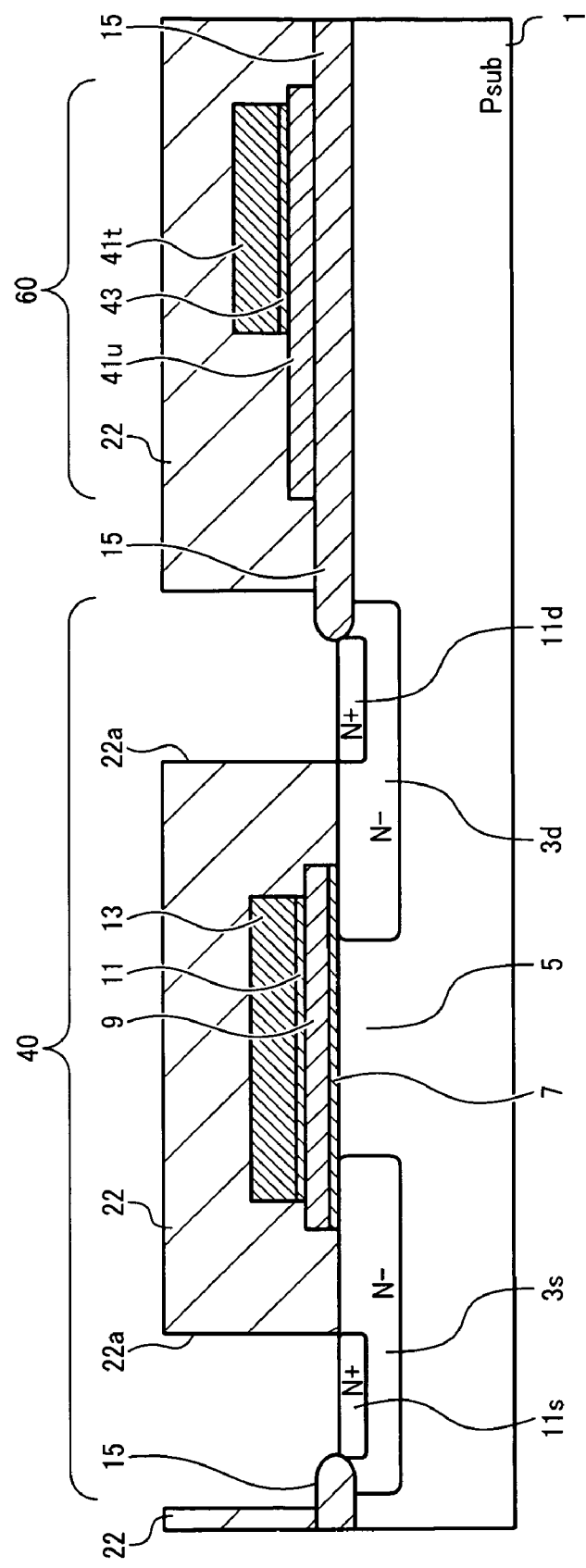

Then, a resist pattern 22 is formed to cover the semiconductor substrate 1 with openings 22a exposing portions of the doped regions 3d and 3s. The openings 22a are aligned parallel to the length of the channel region 5 and spaced away from the adjacent edge of the first gate layer 9. The semiconductor substrate 1 thus masked is subjected to arsenic ion implantation at an energy of approximately 30 KeV with a dose of approximately $5.0*10^{15}$ ions/cm$^2$. After removing the masking resist, the implanted ions are diffused and activated under nitrogen atmosphere at approximately 900° C. for approximately 30 minutes to form the N+ drain and source regions 11d and 11s as shown in FIG. 45, where the resist pattern 22 removed after ion implantation is shown for the purpose of illustration.

Figure 46:
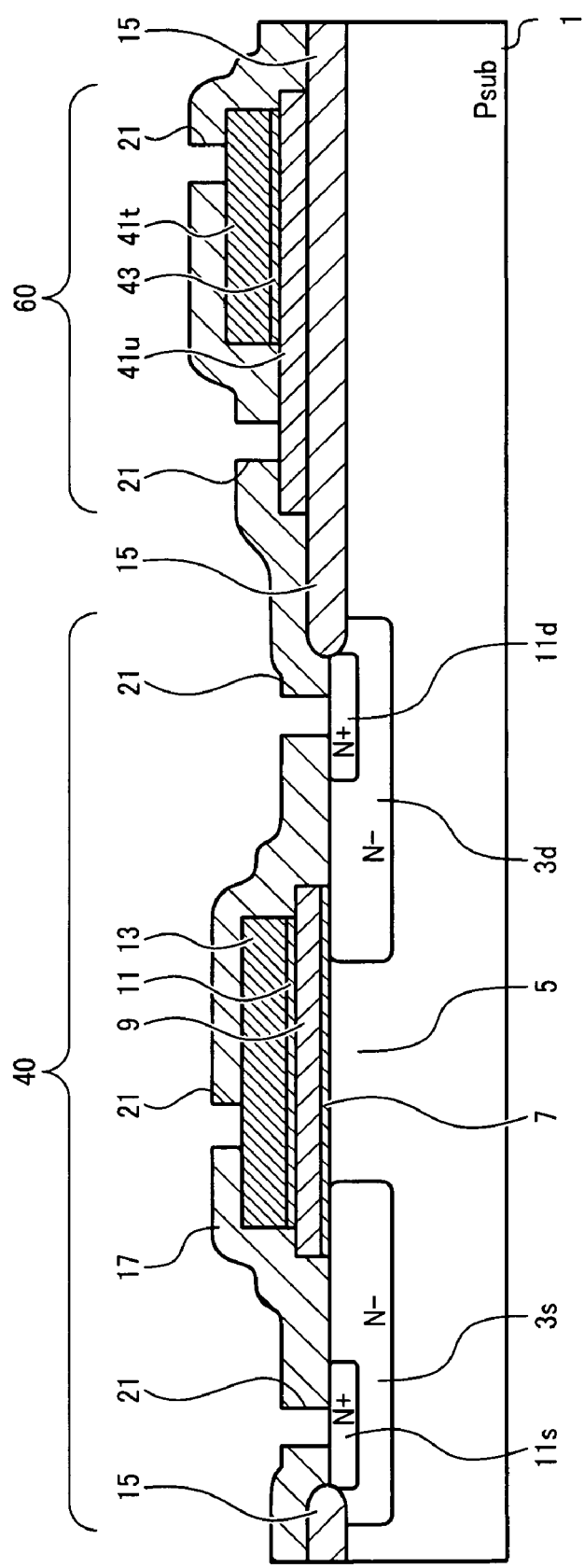

Subsequently, a dielectric film of silicon oxide material, such as a stacked layer of NSG and BPSG, is formed to a thickness of approximately 1000 nm over an entire area of the semiconductor substrate 1. The dielectric film is etched using a patterned resist mask to obtain the insulating layer 17 with the via holes 21 at portions corresponding to the N+ drain and source regions 11d and 11s, the second gate layer 13, and the first and second electrodes 41u and 41t as shown in FIG. 46.

Thereafter, a layer of suitable metal such as aluminum is applied to the insulating layer 17 and patterned to form the metal wires 19g, 19d, and 19s as well as the metal wires 45u and 45t, respectively, so as to obtain the transistor 40 and the capacitor 60 as shown in FIG. 40.

According to this exemplary embodiment (FIGS. 40-46), the capacitor 60 may be fabricated simultaneously with the masked-LDD transistor 40, that is, the first and second capacitor electrodes 41t and 41u as well as the capacitor dielectric layer 43 are formed simultaneously with and of the same material as the corresponding elements of the masked-LDD transistor 40. Thus, the process of integrating high voltage transistors with capacitors may be simplified, eliminating various problems resulting from lengthy process time.

In the above embodiment, the second electrode 41t does not extend beyond the edges of the underlying first electrode 41u, and it may be possible that the formation of the second electrode 41u leave the polycrystalline silicon residue 23 on the side edges of the first electrode 41u. The polysilicon residue 23 may rest on the field oxide layer 15 and therefore is not susceptible to affect the electrical performance of the semiconductor device 1. However, it may be preferable to avoid the formation of the polysilicon residue 23 so as to avoid defects such as short-circuits caused by such residue occasionally coming off during the device fabrication.

Figure 47A:
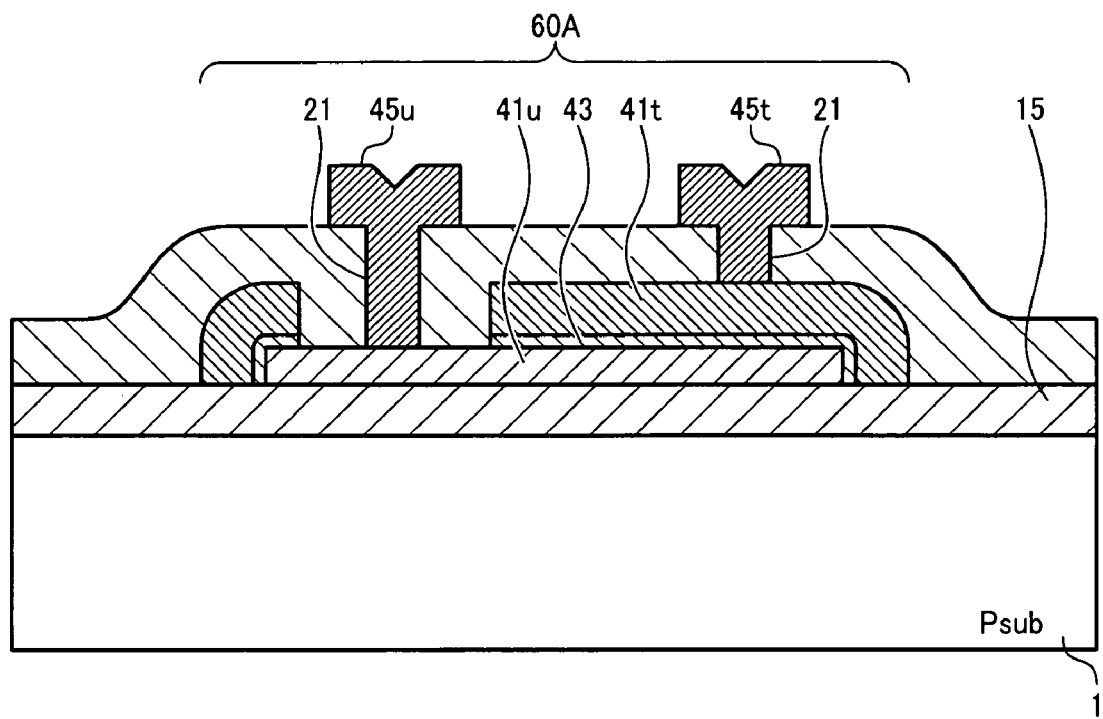
FIGS. 47A and 47B are cross-sectional and plan diagrams, respectively, schematically illustrating an example of a capacitor included in the semiconductor device of FIG. 40.
Figure 47B:
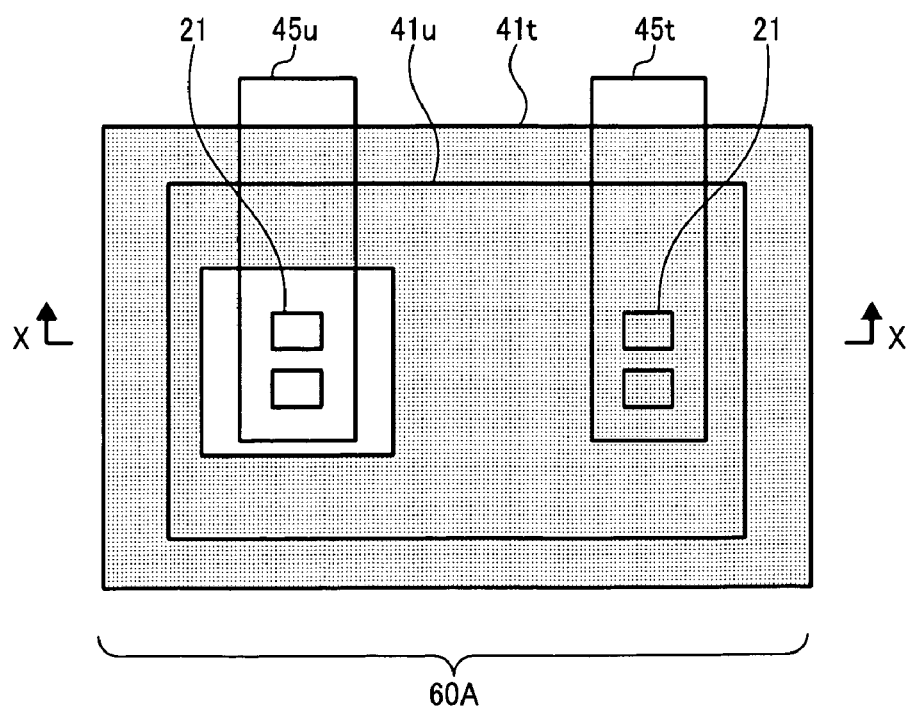

Referring to FIGS. 47A and 47B, schematic diagrams illustrating an example of a capacitor 60A included in the semiconductor device 10 of FIG. 40 are shown. FIG. 47B provides a plan view, and FIG. 47A provides a cross-sectional view taken along line X-X of FIG. 47B.

As shown in FIGS. 47A and 47B, the second electrode 41t covers the top and side surfaces of the first electrode 41u and is separated therefrom by the dielectric layer 43. The second electrode 41t does not extend over an area adjacent the metal wire 45u connected to the first electrode 41u.

According to the configuration shown in FIGS. 47A and 47B, the extended area of the second electrode 41t prevents the formation of the polysilicon residue 23 on the side edges of the first electrode 41u. Further, using the side surface of the first electrode 41u also provides an increased capacitance of the capacitor 60A, allowing greater flexibility in the circuit design.

Figure 48A:
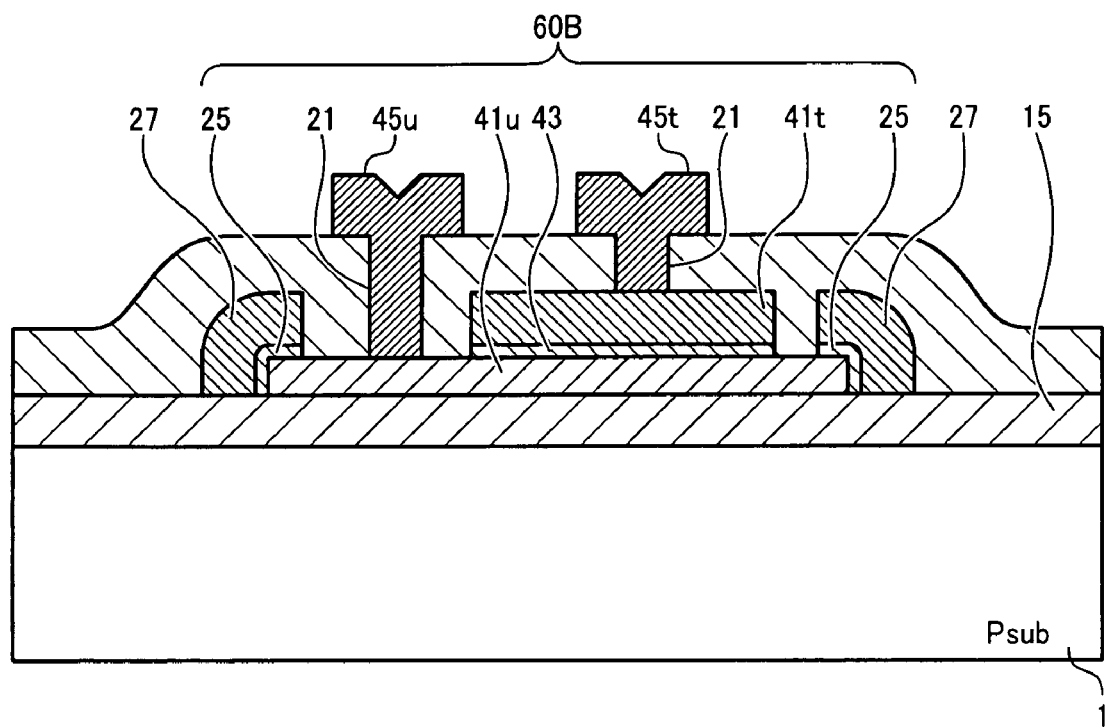
FIGS. 48A and 48B are cross-sectional and plan diagrams, respectively, schematically illustrating another example of the capacitor included in the semiconductor device of FIG. 40.
Figure 48B:
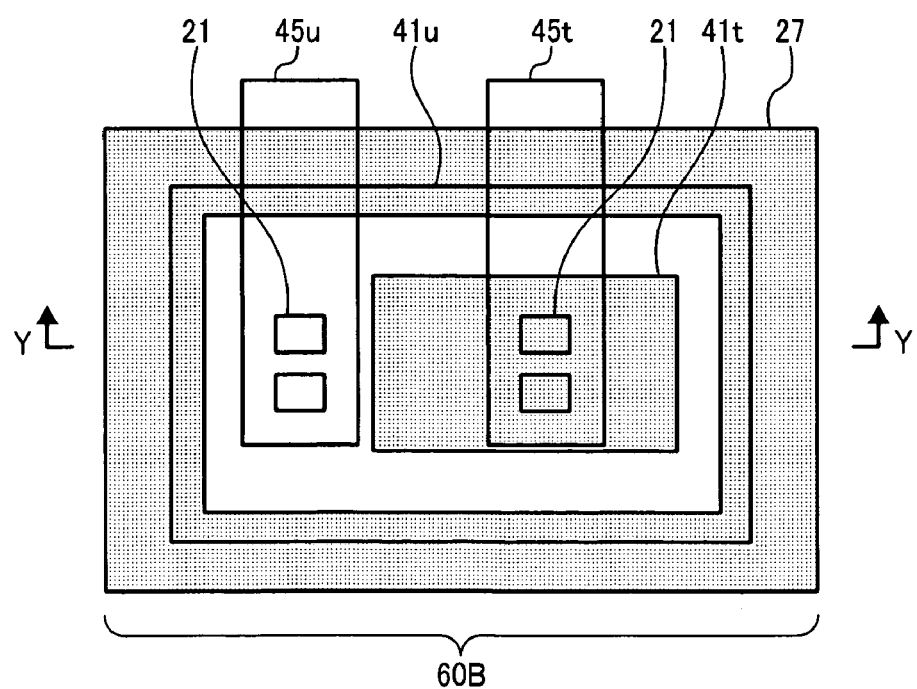

Referring to FIGS. 43A and 48B, schematic diagrams illustrating another example of a capacitor 60B included in the semiconductor device 10 of FIG. 40 are shown. FIG. 48B provides a plan view, and FIG. 48A provides a cross-sectional view taken along line Y-Y of FIG. 48B.

As shown in FIGS. 48A and 48B, the second electrode 41t covers a middle portion of the top surface of the first electrode 41u and the entire side surface of the first electrode 41u, and is separated therefrom by the dielectric layer 43. The second electrode 41t does not extend over an area adjacent the metal wire 45u connected to the first electrode 41u.

According to the configuration shown in FIGS. 48A and 48B, the extended area of the second electrode 41t prevents the formation of the polysilicon residue 23 on the side edges of the first electrode 41u. Further, using the side surface of the first electrode 41u also provides an increased capacitance of the capacitor 60B, allowing greater flexibility in the circuit design.

Numerous additional modifications and variations are possible in light of the above teachings. For example, in alternative embodiments, the conductivity of transistors, semiconductor substrates, well regions, etc. may be changed to the opposite type. It is therefore to be understood that, within the scope of the appended claims, the disclosure of this patent specification may be practiced otherwise than as specifically described herein.

This patent specification is based on Japanese patent application, No. JPAP2007-085935 filed on Mar. 28, 2007 in the Japanese Patent Office, the entire contents of which are incorporated by reference herein.

What is claimed is:

1. A semiconductor device comprising:
    a semiconductor substrate of a first conductivity type; and
    at least one metal-oxide semiconductor transistor constructed on the semiconductor substrate, each of the at least one metal-oxide semiconductor transistor including:
        source and drain electrodes of a second conductivity type disposed beneath a surface of the semiconductor substrate and spaced apart from each other;
        a channel region defined between the source and drain electrodes beneath the surface of the semiconductor substrate;
        a first dielectric layer disposed on the semiconductor substrate and overlapping the source and drain electrodes and the channel region therebetween; and
        a gate electrode disposed on the first dielectric layer and connected to a gate wire to receive a gate voltage,
        the drain electrode including:
            a first drain region located away from the channel region and from the first dielectric layer; and
            a second drain region located between the first drain region and the channel region, having a planar surface extending between an edge of the first drain region and an edge of the first dielectric layer,
        the source electrode including:
            a first source region located away from the channel region and away from the first dielectric layer and;
            a second source region located between the first source region and the channel region, having a planar surface extending between an edge of the first source region and an edge of the first dielectric layer,
            the second source region surrounding the first source region below a surface of the semiconductor substrate,
        the gate electrode including:
            a first gate layer located on the first dielectric layer and being laterally spaced from the first drain region and the first source region and having edges resting over the second drain region and the second source region, the first gate layer being electrically isolated from the gate wire;
            a second gate layer located over the first gate layer, the second gate layer being electrically connected to the gate wire; and
            a second dielectric layer located between, and electrically isolating, the first gate layer and the second gate layer,
    wherein both (a) a surface area of a surface of the second gate layer and (b) a surface area of a surface of the second dielectric layer are less than a surface area of a surface of the first gate layer.

2. The semiconductor device according to claim 1, wherein the second gate layer does not laterally extend beyond an outer edge of the first gate layer.

3. The semiconductor device according to claim 2, further comprising a cover layer configured to cover the outer edge of the first gate layer,
    wherein the cover layer and the second gate layer are simultaneously formed of a same material at different portions over the first gate layer.

4. The semiconductor device according to claim 1, wherein the gate electrode constructed on the semiconductor substrate forms a capacitive divider circuit, including:
    a first electrode corresponding to the first gate layer; and
    a second electrode corresponding to the second gate layer.

5. The semiconductor device according to claim 1, wherein said first drain region has a first doping concentration, and said second drain region has a second doping concentration substantially different from said first doping concentration.

6. The semiconductor device according to claim 1, wherein said metal-oxide semiconductor transistor further comprises a field oxide layer configured to be thicker than said first dielectric layer, and edges of said first gate layer overlie said field oxide layer.

7. The semiconductor device according to claim 1, wherein said second drain region surrounds said first drain region below the surface of the semiconductor substrate.

8. The semiconductor device according to claim 1, wherein the first drain region and the first source region are heavily doped, and the second drain region and the second source region are lightly doped.

9. The semiconductor device according to claim 1, wherein no portion of the first gate layer overlies any portion of the first source region or any portion of the first drain region.

10. The semiconductor device according to claim 1, wherein no portion of the first source region is in direct physical contact with any portion of the first dielectric layer.

11. The semiconductor device according to claim 1, wherein the surface area of the surface of the second dielectric layer is controlled to be substantially less than the surface area of the surface of the first gate layer, causing (1) a reduction in a capacitance between the first gate layer and the second gate layer, and (2) a reduction in a voltage across the first dielectric layer.

12. The semiconductor device according to claim 1, wherein the first gate layer is electrically isolated from the gate wire, by the second dielectric layer located between the first gate layer and the second gate layer.

13. The semiconductor device according to claim 1, wherein both (a) the surface area of the surface of the second gate layer and (b) the surface area of the surface of the second dielectric layer are less than a surface area of a surface of the first dielectric layer 14. The semiconductor device according to claim 1, wherein a thickness of the second dielectric layer is less than a thickness of the first dielectric layer.

15. The semiconductor device according to claim 1, wherein a surface area of a surface of the second drain region is larger than a surface area of a surface of the first drain region, and a surface area of a surface of the second source region is larger than a surface area of a surface of the first source region.

16. The semiconductor device according to claim 1, wherein a central portion of the first gate layer lies on the first dielectric layer, and an edge portion of the first gate layer lies on a field oxide layer thicker than said first dielectric layer, such that a vertical distance between said edge portion and the source and drain electrodes is greater than a vertical distance between said central portion and said source and drain electrodes.

17. A semiconductor device comprising:
a semiconductor substrate of a first conductivity type; and
at least one metal-oxide semiconductor transistor constructed on the semiconductor substrate, each of the at least one metal-oxide semiconductor transistor including:
    source and drain electrodes of a second conductivity type disposed beneath a surface of the semiconductor substrate and spaced apart from each other;
    a channel region defined between the source and drain electrodes beneath the surface of the semiconductor substrate;
    a first dielectric layer disposed on the semiconductor substrate and overlapping the source and drain electrodes and the channel region therebetween; and
    a gate electrode disposed on the first dielectric layer and connected to a gate wire to receive a gate voltage,
the drain electrode including:
    a first drain region located away from the channel region and from the first dielectric layer; and
    a second drain region located between the first drain region and the channel region, having a planar surface extending between an edge of the first drain region and an edge of the first dielectric layer,
the gate electrode including:
    a first gate layer located on the first dielectric layer and being laterally spaced from the first drain region and having edges resting over the second drain region, the first gate layer being electrically isolated from the gate wire;
    a second gate layer located over the first gate layer, the second gate layer being electrically connected to the gate wire; and
    a second dielectric layer located between, and electrically isolating, the first gate layer and the second gate layer, wherein both (a) a surface area of a surface of the second gate layer and (b) a surface area of a surface of the second dielectric layer are less than a surface area of a surface of the first gate layer.

18. A semiconductor device comprising:
a semiconductor substrate of a first conductivity type; and
at least one metal-oxide semiconductor transistor constructed on the semiconductor substrate, each of the at least one metal-oxide semiconductor transistor including:
    source and drain electrodes of a second conductivity type disposed beneath a surface of the semiconductor substrate and spaced apart from each other;
    a channel region defined between the source and drain electrodes beneath the surface of the semiconductor substrate;
    a first dielectric layer disposed on the semiconductor substrate and overlapping the source and drain electrodes and the channel region therebetween; and
    a gate electrode disposed on the first dielectric layer and connected to a gate wire to receive a gate voltage,
the drain electrode including:
    a first drain region located away from the channel region and from the first dielectric layer; and
    a second drain region located between the first drain region and the channel region, having a planar surface extending between an edge of the first drain region and an edge of the first dielectric layer,
the gate electrode including:
    a first gate layer located on the first dielectric layer and being laterally spaced from the first drain region and having edges resting over the second drain region, the first gate layer being electrically isolated from the gate wire;
    a second gate layer located over the first gate layer, the second gate layer being electrically connected to the gate wire; and
    a second dielectric layer located between, and electrically isolating, the first gate layer and the second gate layer,
wherein the second drain region surrounds the first drain region below the surface of the semiconductor substrate, and
wherein both (a) a surface area of a surface of the second gate layer and (b) a surface area of a surface of the second dielectric layer are less than a surface area of a surface of the first gate layer.

19. The semiconductor device according to claim 18, wherein no portion of the first gate layer overlies any portion of the first source region or any portion of the first drain region.

20. The semiconductor device according to claim 18, wherein no portion of the first source region is in direct physical contact with any portion of the first dielectric layer.

* * * * *